(12) United States Patent
Takahashi

(10) Patent No.: US 12,374,594 B2
(45) Date of Patent: Jul. 29, 2025

(54) SEMICONDUCTOR DEVICE AND ELECTRONIC DEVICE

(71) Applicant: Kioxia Corporation, Tokyo (JP)

(72) Inventor: Hideki Takahashi, Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 636 days.

(21) Appl. No.: 17/684,534

(22) Filed: Mar. 2, 2022

(65) Prior Publication Data

US 2023/0005805 A1 Jan. 5, 2023

(30) Foreign Application Priority Data

Jun. 30, 2021 (JP) ................................ 2021-109060

(51) Int. Cl.
*H01L 23/31* (2006.01)
*H01L 23/12* (2006.01)
(Continued)

(52) U.S. Cl.
CPC .......... *H01L 23/3121* (2013.01); *H01L 23/12* (2013.01); *H01L 23/32* (2013.01);
(Continued)

(58) Field of Classification Search
CPC ..... H01L 23/3121; H01L 23/12; H01L 23/32; H01L 23/49816; H01L 23/49838; H01L 25/0657; H01L 2225/06562; H01L 24/45; H01L 24/48; H01L 2224/45144; H01L 2224/48091; H01L 2224/48137; H01L 2224/48147; H01L 2224/48227; H01L 2225/06506; H01L 2225/0651; H01L 2225/06589; H01L 2924/181; H01L 2924/1815; H01L 25/18; H01L 23/49827; H01L 2924/15311; H01L 23/3114; H01L 23/3128; H05K 1/182; H05K 3/284; H05K 1/18
See application file for complete search history.

(56) References Cited

U.S. PATENT DOCUMENTS 5,730,620 A * 3/1998 Chan ...................... H01R 12/52
439/526
6,190,181 B1 2/2001 Affolter et al.
(Continued)

FOREIGN PATENT DOCUMENTS

JP H08-046091 A 2/1996
JP H10-144824 A 5/1998
(Continued)

*Primary Examiner* — Jonathan Han
(74) *Attorney, Agent, or Firm* — Foley & Lardner LLP

(57) ABSTRACT

A semiconductor device includes a substrate, a semiconductor chip, a resin, and a terminal. The substrate spreads along a first surface. The semiconductor chip is provided above the substrate in a first direction. The resin covers the semiconductor chip. The terminal is provided below the substrate in the first direction. The resin includes a first portion and a second portion. A height of the first portion in the first direction is higher than a height of the second portion in the first direction. An edge of the second portion in a second direction along the first surface is a part of an edge of the resin in the second direction.

20 Claims, 10 Drawing Sheets

(51) Int. Cl.
*H01L 23/32* (2006.01)
*H01L 23/498* (2006.01)
*H01L 25/065* (2023.01)
*H05K 1/18* (2006.01)

(52) U.S. Cl.
CPC .. *H01L 23/49816* (2013.01); *H01L 23/49838* (2013.01); *H01L 25/0657* (2013.01); *H05K 1/182* (2013.01); *H01L 2225/06562* (2013.01)

(56) References Cited

U.S. PATENT DOCUMENTS

| | | |
|---|---|---|
| 6,390,826 B1 | 5/2002 | Affolter et al. |
| 7,632,128 B2 | 12/2009 | Lin et al. |
| 2015/0243572 A1* | 8/2015 | Albers ................ H01L 23/3128 257/778 |
| 2020/0203301 A1* | 6/2020 | Yu ..................... H01L 23/49838 |

FOREIGN PATENT DOCUMENTS

| JP | H10-242616 A | 9/1998 |
|---|---|---|
| JP | 2006-237305 A | 9/2006 |

* cited by examiner

SEMICONDUCTOR DEVICE AND ELECTRONIC DEVICE

CROSS-REFERENCE TO RELATED APPLICATION(S)

This application is based upon and claims the benefit of priority from Japanese Patent Application No. 2021-109060, filed Jun. 30, 2021, the entire contents of which are incorporated herein by reference.

FIELD

Embodiments described herein relate generally to a semiconductor device and an electronic device.

BACKGROUND

A semiconductor device incorporating a semiconductor chip is known. The semiconductor chip includes, for example, a chip in which a circuit of a NAND memory capable of storing data in a non-volatile manner is formed. The semiconductor device is mounted on a printed circuit board via a solder or a socket. The printed circuit board on which the semiconductor device is mounted is provided as an electronic device in an information processing apparatus.

DETAILED DESCRIPTION

Figure 1:
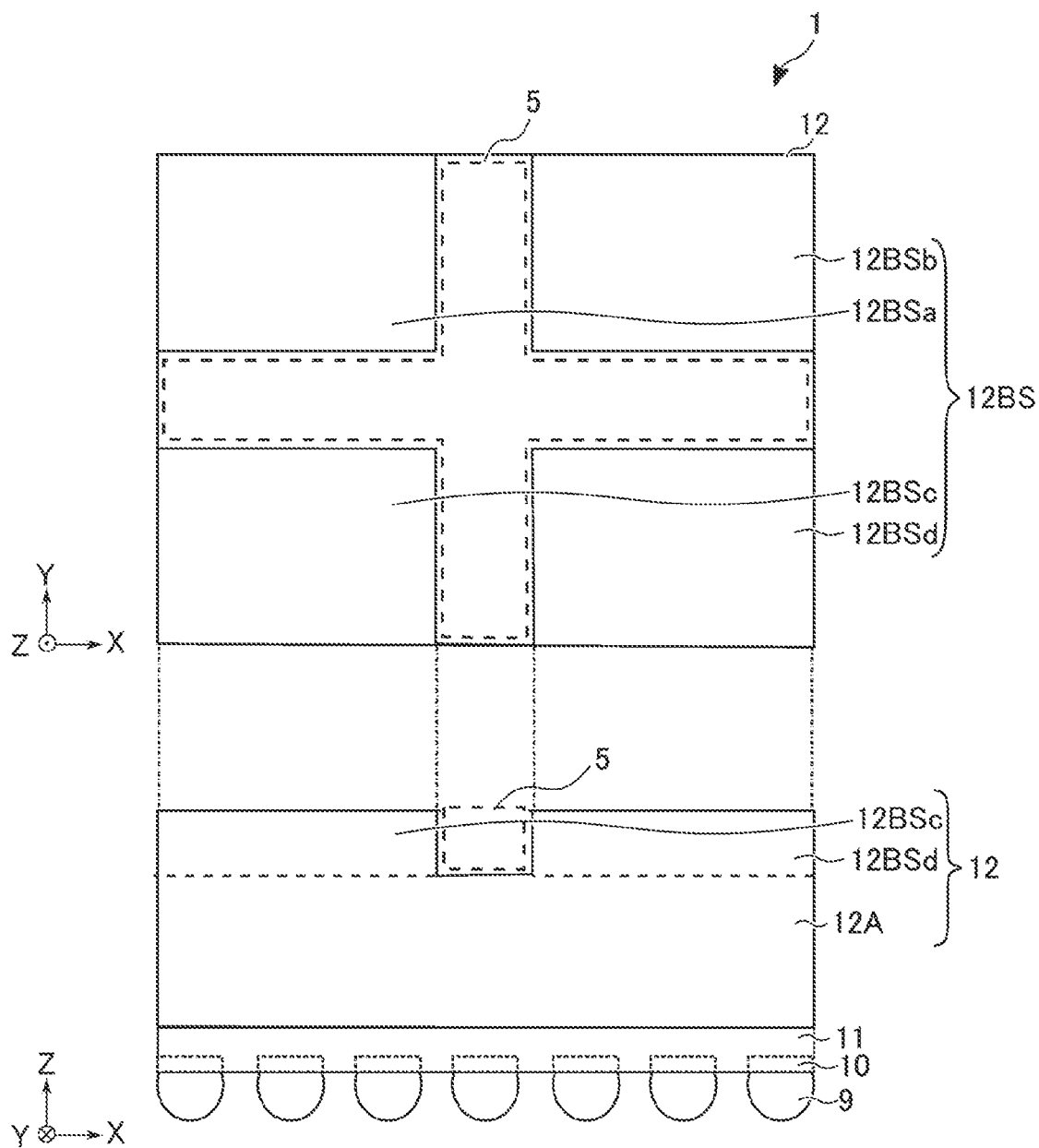
FIG. 1 illustrates a configuration example of a semiconductor device according to a first embodiment.

At least one embodiment provides a semiconductor device and an electronic device which may be easily attached to and detached from a printed circuit board.

In general, according to at least one embodiment, a semiconductor device includes a substrate, a semiconductor chip, a resin, and a terminal. The substrate spreads along a first surface. The semiconductor chip is provided above the substrate in a first direction. The resin covers the semiconductor chip.

The terminal is provided below the substrate in the first direction. The resin includes a first portion and a second portion. A height of the first portion in the first direction is higher than a height of the second portion in the first direction. An edge of the second portion in a second direction along the first surface is a part of an edge of the resin in the second direction.

Hereinafter, embodiments will be described with reference to the drawings. Each embodiment illustrates an apparatus or method for embodying the technical idea of the disclosure. The drawings are schematic or conceptual, and the dimensions and ratios of each drawing are not necessarily the same as the actual ones. All descriptions of one embodiment are also applied as descriptions of another embodiment, unless explicitly or implicitly excluded. The technical idea of the present disclosure is not specified by the shape, structure, arrangement of components, and the like.

In addition, in the following description, the same reference numerals will be given to components having substantially the same function and configuration. The number after the letter constituting the reference sign is used to distinguish between elements that are referenced by the reference signs containing the same letter and have a similar configuration. When it is not necessary to distinguish between the elements denoted by the reference signs containing the same letter, each of these elements is referenced by the reference sign containing only the letter.

[1] First Embodiment

[1-1] Configuration (Structure)

Hereinafter, an example of a configuration of a semiconductor device according to a first embodiment will be described.

In addition, in the drawings referenced below, a X direction and a Y direction are directions along a surface of a substrate 11 (see, e.g., FIG. 1) in the semiconductor device to be described later. A Z direction corresponds to a direction perpendicular to the surface of the substrate 11 (see, e.g., FIG. 1) to be described later. Further, in the drawings referenced below, the positive direction of the vertical axis may be referred to as the upper side, and the negative direction may be referred to as the lower side. Similarly, the positive direction of the horizontal axis may be referred to as the right side, and the negative direction may be referred to as the left side.

For example, in the XY plan view seen from the +Z direction, the upper side indicates the +Y direction and the lower side indicates the −Y direction. In the XY plan view seen from the +Z direction, the right side indicates the +X direction and the left side indicates the −X direction. For example, in the XZ plan view seen from the −Y direction, the upper side indicates the +Z direction and the lower side indicates the −Z direction. In the XZ plan view seen from the −Y direction, the right side indicates the +X direction and the left side indicates the −X direction.

In some drawings, hatching is appropriately added in order to make the drawings easier to see. The hatching added to the drawings is not necessarily related to the materials or characteristics of components to which the hatching is added. In the cross-sectional view, components such as insulator layers, wirings, and contacts are appropriately omitted in order to make the drawing easier to see.

[1-1-1] Configuration of Semiconductor Device 1

FIG. 1 illustrates a configuration example of a semiconductor device 1 according to the first embodiment. The upper view of FIG. 1 is a plan view (XY plane) of the semiconductor device 1 seen from the +Z direction, and the lower view of FIG. 1 is a side view (XZ plane) of the semiconductor device 1 seen from the −Y direction. The semiconductor device is, for example, a package device that encapsulates a semiconductor chip.

As illustrated in FIG. 1, the semiconductor device 1 includes, for example, a plurality of terminals 10, a plurality of solder balls 9, the substrate 11, and a sealing resin 12. The substrate 11 is formed in, for example, a plate shape spreading along the XY plane. The substrate 11 includes, for example, an insulator such as ceramic. The substrate 11 includes the terminals 10 at the bottom (a portion on the −Z direction side).

The solder balls 9 are provided on the lower surface of the substrate 11 (the surface spreading in the XY plane on the −Z direction side). The solder balls are formed in, for example, a spherical shape or a hemispherical shape. The solder balls are arranged in a grid shape on the XY plane below the substrate 11. The number of solder balls 9 may be optionally set. The solder balls 9 contain a conductor, for example, solder. The solder balls 9 are connected to the respective terminals 10. The solder balls 9 have a structure such as, for example, a Ball Grid Array (BGA) or a Land Grid Array (LGA). The BGA and the LGA are one of terminal layout schemes, and are used, for example, when there are many input and output pins and/or when the area of the semiconductor device 1 seen from the Z direction is prevented. The solder balls 9 are used as external terminals of the semiconductor device 1. The solder balls 9 are connected to a circuit pattern of a printed circuit board 15 (see, e.g., FIG. 2) to be described later.

The sealing resin 12 is located above the substrate 11 (in the +Z direction). The sealing resin 12 has a rectangular shape in the XY plane. The sealing resin 12 has edges coinciding with the edges of the substrate 11 in the XY plane.

The sealing resin 12 has, for example, a cross-shaped groove 5 spreading along the XY plane. Hereinafter, the groove 5 will be described in detail. The sealing resin 12 has a difference in height in the Z direction depending on the location. Specifically, it is as follows. The sealing resin 12 includes a first portion 12A and a second portion 12B. The first portion 12A occupies a lower side (−Z side) portion of the sealing resin 12, and has a rectangular parallelepiped shape. The second portion 12B occupies an upper side (+Z side) portion of the sealing resin 12, and has a common surface with the upper surface (XY surface seen from the +Z direction) of the first portion 12A. The first portion 12A and the second portion 12B are continuous (that is, continuously provided) in the Z direction and are integrally formed.

The second portion 12B includes four sub-portions 12BS (12BSa, 12BSb, 12BSc and 12BSd). The sub-portion 12BSa is provided in an upper left portion of the four surface along the XY plane in the second portion 12B. In other words, the sub-portion 12BSa is located on the −X direction side and on the +Y direction side among the four sub-portions 12BS. Similarly, the sub-portions 12BSb, 12BSc and 12BSd are provided in upper right, lower left, and lower right portions of the four surface along the XY plane in the second portion 12B, respectively. In other words, the sub-portion 12BSb is located on the +X direction side and on the +Y direction side among the four sub-portions 12BS, the sub-portion 12BSc is located on the −X direction side and on the −Y direction side among the four sub-portions 12BS, and the sub-portion 12BSd is located on the +X direction side and on the −Y direction side among the four sub-portions 12BS. The four sub-portions 12BS are spaced apart from each other. Each sub-portion 12BS has, for example, a rectangular parallelepiped shape. With this shape and arrangement of the respective sub-portions 12BS, the groove 5 is formed between the respective sub-portions 12BS. That is, the respective sub-portions 12BS are disposed apart from each other by the groove 5. The bottom surface of the groove 5 corresponds to a part of the upper surface of the first portion 12A. By having this shape, the sealing resin 12 has a difference in height in the Z direction depending on the location. That is, the sealing resin 12 has a lower height in the Z direction in a region between the sub-portions 12BSa, 12BSb, 12BSc and 12BSd (i.e., in the groove 5) compared to the sub-portions 12BSa, 12BSb, 12BSc and 12BSd. The groove 5 refers to a space generated in the region between the sub-portions 12BSa, 12BSb, 12BSc and 12BSd. Accordingly, in at least one embodiment, the groove 5 is a space created by a difference in height in the Z direction of the sealing resin 12.

The sealing resin 12 may also be understood as follows. The sealing resin 12 may be divided into a portion having the second portion 12B and a portion having no second portion 12B. The portion having no second portion 12B is a portion of the first portion 12A below the groove 5, and the portion having the second portion 12B is all the sealing resin 12 other than the aforementioned portion below the groove 5. The portion having the second portion 12B has a higher height in the Z direction than the height of the portion having no second portion 12B.

The groove 5 may be formed, for example, by cutting a portion of the rectangular sealing resin before processing where the groove 5 is to be formed with a grinder or the like. Further, the groove may be formed, for example, by forming irregularities corresponding to the groove 5 in a mold into which a liquid-phase resin is poured to form the sealing resin 12.

Details of the depth and shape of the groove 5 will be described later. Here, the depth of the groove 5 corresponds to the height of the sub-portion 12BS in the Z direction.

[1-1-2] Configuration of Electronic Device 100

Next, an example of a configuration in a state where the semiconductor device 1 is fixed or provided on the printed circuit board 15 will be described with reference to FIG. 2.

Figure 2:
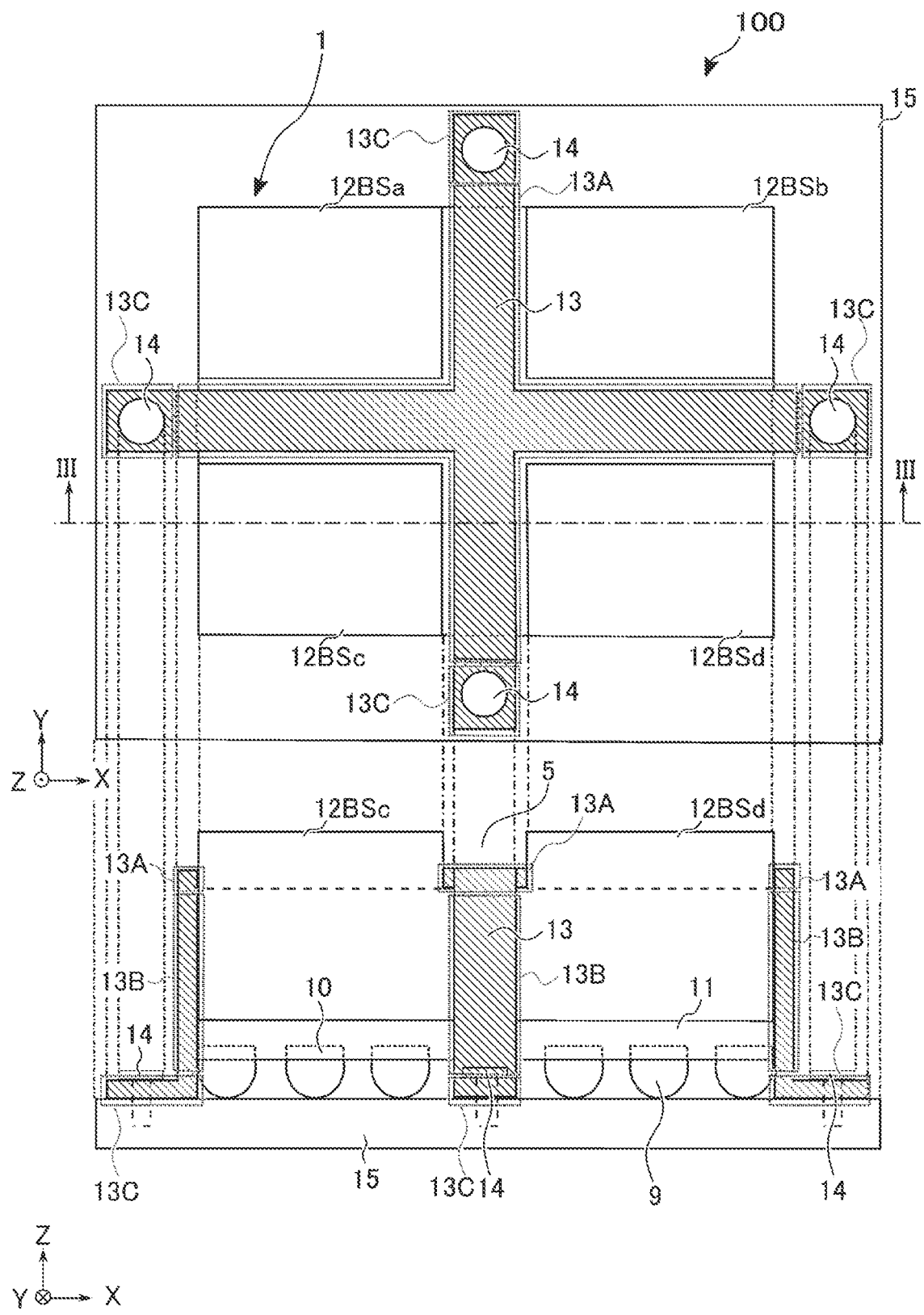
FIG. 2 illustrates a configuration example of an electronic device according to the first embodiment.

FIG. 2 illustrates a configuration example of an electronic device 100 according to the first embodiment. The upper view of FIG. 2 is a plan view of the electronic device 100, and illustrates a view seen from the same direction as the upper view of FIG. 1. The lower view of FIG. 2 is a side view of the electronic device 100, and illustrates a view seen from the same direction as the lower view of FIG. 1.

As illustrated in FIG. 2, the electronic device 100 includes, for example, the semiconductor device 1 illustrated in FIG. 1, a mounting component 13, a screw 14, and the printed circuit board 15. The screw 14 is an example of a fixing component.

The printed circuit board 15 is located below the semiconductor device 1 (in the −Z direction). When the semiconductor device 1 is fixed or provided on the printed circuit board 15, the solder balls 9 come into contact with a circuit pattern designed on the printed circuit board 15, so that the printed circuit board 15 and the solder balls 9 are electrically connected to each other. The semiconductor device 1 and the circuit pattern of the printed circuit board 15 may be directly connected via the solder balls 9, or may be connected via other electrodes such as, for example, a sheet type socket. The printed circuit board 15 has a hole into which the screw 14 is inserted.

The mounting component 13 has a cross-shaped portion spreading along the XY plane, a portion extending in the Z direction, and a portion in contact with the printed circuit board 15. The cross-shaped portion spreading along the XY plane, the portion extending in the Z direction, and the portion in contact with the printed circuit board 15 may be hereinafter referred to as an upper portion 13A, a side portion 13B, and a contact portion 13C, respectively. The upper portion 13A, the side portion 13B, and the contact portion 13C are continuously and integrally formed. A part of the upper portion 13A and a part of the side portion 13B are connected at a right angle within a range that allows errors in manufacturing. The other part of the side portion 13B and a part of the contact portion 13C are connected at a right angle within a range that allows errors in manufacturing.

The upper portion 13A has a cross shape spreading along the XY plane. For example, the cross shape of the upper portion 13A is similar to or slightly smaller than that of the groove 5. The upper portion 13A has a shape capable of being fitted into the groove 5. When the upper portion 13A is fitted into the groove 5, the mounting component 13 may prevent a shift of the semiconductor device 1 in the XY direction. Further, when the upper portion 13A is fitted into the groove 5, the electronic device 100 according to the first embodiment can be kept in height in the Z direction.

The upper portion 13A may have a size in the XY direction capable of being fitted into the groove 5. In order to prevent the shift of the semiconductor device 1 in the XY direction, it is desirable that the size of the upper portion 13A in the XY direction be close to the size of the groove 5 in the XY direction. More specifically, the meaning of the size of the upper portion 13A in the XY direction being close to the size of the groove 5 in the XY direction includes that the widths in the X direction and the Y direction of respective portions constituting the cross of the upper portion 13A are close respectively to the widths in the X direction and the Y direction of respective portions constituting the cross of the groove 5 and/or that the lengths of the upper portion 13A in the X direction and the Y direction are close respectively to the lengths of the groove 5 in the X direction and the Y direction.

The height (or thickness) of the upper portion 13A in the Z direction may exceed the depth of the groove 5 as long as it prevents the shift of the semiconductor device 1 in the XY direction. However, in order to keep the height of the electronic device 100 in the Z direction, it is desirable that the height of the upper portion 13A in the Z direction be within the depth of the groove 5. Further, the groove 5 may have a depth such the upper portion 13A is stably fitted into the groove 5.

The side portion 13B extends in the Z direction. In a state where the upper portion 13A is fitted into the groove 5, the side portion 13B extends in the Z direction from an edge of the cross of the upper portion 13A to the printed circuit board 15. In other words, in a state where the upper portion 13A is fitted into the groove 5, the side portion 13B extends in the Z direction along the side surface of the semiconductor device 1. The side portion 13B may have a length in the Z direction by which a shift of the semiconductor device 1 in the Z direction may be prevented when the semiconductor device 1 is fixed or provided on the printed circuit board 15.

The contact portion 13C has a shape spreading along the XY plane. The contact portion 13C has a hole through which the screw 14 passes. In a state where the semiconductor device 1 is fixed or provided on the printed circuit board 15, the contact portion 13C is in contact with the printed circuit board 15.

In this way, the mounting component 13 mainly prevents the shift of the semiconductor device 1 in the XY direction by the upper portion 13A, mainly prevents the shift of the semiconductor device 1 in the Z direction by the side portion 13B, and fixes, along with the screw 14, the semiconductor device 1 to the printed circuit board 15 via the contact portion 13C. That is, the mounting component 13 has a function of pressing the semiconductor device 1 against the printed circuit board 15.

The screw 14 has a function of fixing the mounting component 13 to the printed circuit board 15. The screw 14 passes through the hole in the contact portion 13C and is inserted into the hole in the printed circuit board 15. For example, when the screw 14 is a male screw, a groove corresponding to a thread on the screw 14 may be formed inside the hole in the printed circuit board 15 into which the screw 14 is inserted. By inserting and fitting the screw 14 into the hole in the printed circuit board 15, the mounting component 13 sandwiched between the screw 14 and the printed circuit board 15 is fixed. By fixing the mounting component 13, the semiconductor device 1 is fixed to the printed circuit board 15. That is, the screw 14 fixes the mounting component 13 and the semiconductor device 1 to the printed circuit board 15. In the example of FIG. 2, four screws 14 are illustrated. However, the number of screws 14 may be optionally set as long as they are capable of fixing the mounting component 13 to the printed circuit board 15. For example, the electronic device 100 may fix one contact portion 13C with two or more screws.

As used herein, the term "fixing" means fixing made by tightening the screw 14. Therefore, when it is desired to remove the semiconductor device 1 from the printed circuit board 15, the semiconductor device 1 may be easily removed by loosening the screw 14.

As described above, the solder balls 9 of the semiconductor device 1 are connected to, for example, the printed circuit board 15 of the electronic device 100. The solder balls 9 and the printed circuit board 15 are not fixed as in soldering, and may be separated from each other. That is, the semiconductor device 1 according to the first embodiment is designed to be movable with respect to the printed circuit board 15 of the electronic device 100.

From the above, in the electronic device 100 according to the first embodiment, the sealing resin 12 of the semiconductor device 1 has the groove 5, the mounting component 13 has a shape to be fitted into the groove 5, and the mounting component 13 may be easily removed by the screw 14 or the like.

In the electronic device 100 according to the first embodiment, the groove 5 of the semiconductor device 1 and the mounting component 13 may have a shape in which the upper portion 13A capable of being fitted into the groove 5, so that the semiconductor device 1 may be fixed to the printed circuit board 15 by the mounting component 13.

That is, the cross shape of the groove 5 and the upper portion 13A may be, for example, in such a way that two lines constituting the cross are bent, are formed in a crank shape, or are curved. Further, the respective portions of the cross of the groove 5 and the upper portion 13A may not be connected at a right angle. Further, the cross shape of the groove 5 and the upper portion 13A may be biased to either the +X direction or the −X direction, or may be biased to either the +Y direction or the −Y direction.

Further, the groove 5 and the upper portion 13A may not have a cross shape, but may have, for example, a linear shape or a rectangular shape. Even in this case, the shift of the semiconductor device 1 in the XY direction may be prevented when the upper portion 13A is fitted into the groove 5. The structure in which the upper portion 13A is fitted into the groove 5 so that the semiconductor device 1 may be fixed to the printed circuit board 15 by the mounting component 13 includes a structure in which at least one of the edges of the groove 5 in the XY plane includes the edge of the sealing resin 12 in the XY plane. Such a structure will be described in another embodiment to be described later.

Similarly, according to the structure in which the upper portion 13A is fitted into the groove 5 so that the semiconductor device 1 may be fixed to the printed circuit board 15 by the mounting component 13, the shape of the semiconductor device 1 in the XY plane seen from the +Z direction may not be a quadrangle. The shape of the semiconductor device 1 in the XY plane seen from the +Z direction may be, for example, a shape in which one of the corners of a quadrangle is chamfered.

[1-1-3] Cross-Sectional Structure of Electronic Device 100

Figure 3:
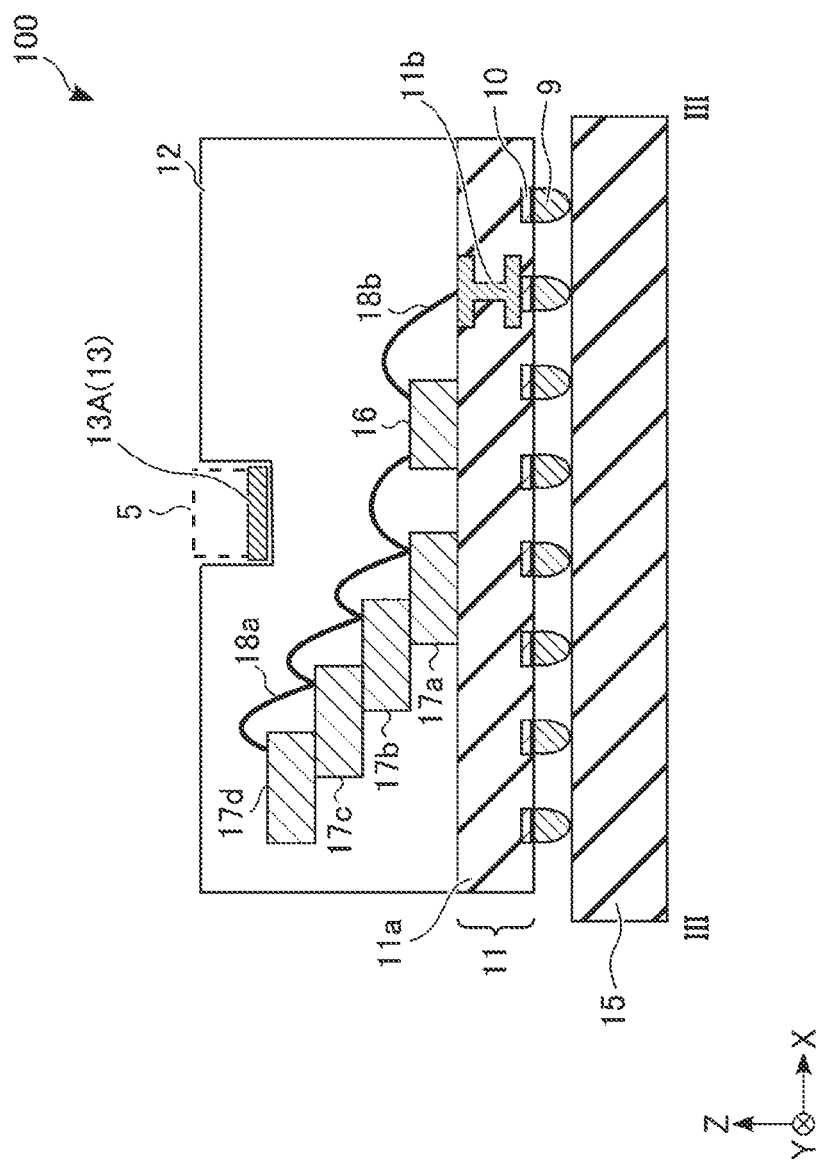
FIG. 3 is a cross-sectional view taken along line III-III in FIG. 2, and illustrates an example of a cross-sectional structure of the electronic device according to the first embodiment.

FIG. 3 is a cross-sectional view taken along line III-III in FIG. 2, and illustrates an example of a cross-sectional structure of the electronic device 100 according to the first embodiment. As illustrated in FIG. 3, the semiconductor device 1 provided in the electronic device 100 includes, for example, a plurality of NAND chips 17 (17a to 17d), a controller chip 16, and wires 18a and 18b, in addition to the structure described with reference to FIGS. 1 and 2. The substrate 11 includes an insulator portion 11a and a conductor portion 11b. The semiconductor device 1 is, for example, a memory system such as a Solid State Drive (SSD) or a Universal Flash Storage (UFS) device. Hereinafter, the cross-sectional structure of the electronic device 100 will be described.

The NAND chips 17a to 17d, the controller chip 16, and the wires 18a and 18b are provided above the substrate 11 (in +Z direction). The NAND chips 17a to 17d, the controller chip 16, and the wires 18a and 18b are covered with the sealing resin 12. In other words, the NAND chips 17a to 17d, the controller chip 16, and the wires 18a and 18b are located between the substrate 11 and a part of the sealing resin 12.

The NAND chips 17a to 17d are, for example, semiconductor chips in which a circuit of a NAND flash memory circuit is formed using a semiconductor material. The NAND flash memory is a storage device capable of storing data in a non-volatile manner. Each of the NAND chips 17a to 17d is formed in, for example, a plate shape spreading along the XY plane. For example, the NAND chip 17a is stacked above the substrate 11, the NAND chip 17b is stacked above the NAND chip 17a, the NAND chip 17c is stacked above the NAND chip 17b, and the NAND chip 17d is stacked above the NAND chip 17c. For example, the respective NAND chips 17 are insulated from each other with an insulator layer interposed therebetween.

For example, the NAND chip 17b does not completely overlap above the NAND chip 17a, but is provided in a stepwise manner with a slight shift on the XY plane. Similarly, the NAND chip 17c does not completely overlap the NAND chip 17b, but is provided in a stepwise manner with a slight shift on the XY plane. Similarly, the NAND chip 17d does not completely overlap the NAND chip 17c, but is provided in a stepwise manner with a slight shift on the XY plane. By providing the respective NAND chips 17a to 17d in a stepwise manner, the wire 18a may be connected thereto. That is, the width (amount or size) of the shift may be the width (amount or size) by which the NAND chips 17 and the wire 18a may be connected.

In the example of FIG. 3, the NAND chips 17a to 17d are illustrated. However, the number of NAND chips 17 may be optionally set.

The controller chip 16 is, for example, a semiconductor chip in which a circuit of a memory controller is formed using a semiconductor material. The memory controller is a control device that controls the NAND flash memory formed in the NAND chip 17.

The wire 18a electrically connects each of the NAND chips 17a to 17d to the controller chip 16. Specifically, the NAND chips 17a to 17d have pads connected to the NAND flash memory, and the controller chip 16 has a pad connected to the memory controller. Then, the wire 18a electrically connects the pads provided on the NAND chips 17a to 17d to a part of the pad provided on the controller chip 16. In this way, each NAND flash memory provided in the NAND chips 17a to 17d and the memory controller provided in the controller chip 16 transmit and receive various signals via the wire 18a.

The wire 18b electrically connects the controller chip 16 to the conductor portion 11b of the substrate 11. Specifically, the wire 18b electrically connects the other part of the pad provided on the controller chip 16 to the conductor portion 11b of the substrate 11. As will be described in detail below, the controller chip 16 transmits and receives signals to and from the printed circuit board 15 via the wire 18b, the conductor portion 11b of the substrate 11, the terminals 10, and the solder balls 9. A connection method such as the wires 18a and 18b is referred to as, for example, wire bonding. The wires 18a and 18b are also referred to as bonding wires. The wires 18a and 18b contain, for example, gold.

The conductor portion 11b of the substrate 11 is, for example, a wiring formed in the substrate 11. Such wiring is also referred to as a through silicon electrode (TSV). The conductor portion 11b of the substrate 11 is electrically connected to the terminals 10 and the solder balls 9.

For example, the solder balls 9 supply a power supply voltage to the semiconductor device 1 from the outside of the semiconductor device 1 via the printed circuit board 15. For example, the solder balls 9 are used to supply the power supply voltage to the NAND chips 17a to 17d and the controller chip 16. Further, for example, the solder balls 9 are used for transmission and reception of signals between an external device of the semiconductor device 1 and the controller chip 16 via the printed circuit board 15.

[1-1-4] Structure of Information Processing Apparatus 600

Figure 4:
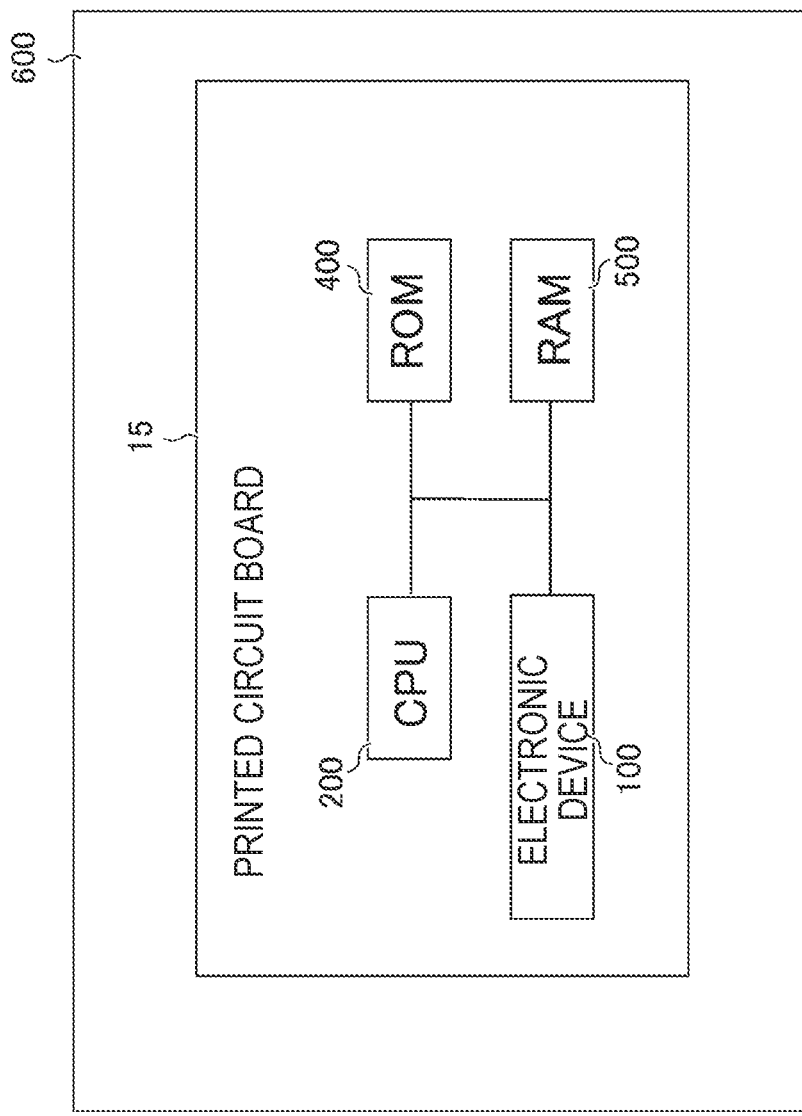
FIG. 4 is a block diagram illustrating an example of a configuration of an information processing apparatus including the semiconductor device according to the first embodiment.

FIG. 4 is a block diagram illustrating an example of a configuration of an information processing apparatus 600 including the semiconductor device 1 according to the first embodiment. The information processing apparatus 600 includes a read only memory (ROM) 400, a random access memory (RAM) 500, and the printed circuit board 15 described with reference to FIGS. 2 and 3. The information processing apparatus 600 is, for example, a laptop PC, a smart phone, a tablet computer, or an in-vehicle device. A Central Processing Unit (CPU), the ROM 400, the RAM 500, and the electronic device 100 (SSD in an example) are mounted on the printed circuit board 15. The ROM 400 and the RAM 500 may be connected via a connector or a socket provided on the printed circuit board 15.

The ROM 400 stores, for example, a program executed by the CPU 200 in a non-volatile manner. This program is loaded from the ROM 400 into the RAM 500 when the electronic device 100 operates. The RAM 500 stores the program loaded from the ROM 400. The CPU 200 executes the program loaded in the RAM 500. The CPU 200 uses the RAM 500 as a work memory. Further, the CPU 200 is connected to the electronic device 100. The CPU 200 requests the electronic device 100 to write data or to read data. The electronic device 100 includes the semiconductor device 1 according to the first embodiment.

[1-2] Advantages (Effects) of First Embodiment

With the semiconductor device 1 and the electronic device 100 having the semiconductor device 1 according to the first embodiment described above, it is possible to fix the semiconductor device 1 to the printed circuit board 15 by the mounting component 13. Thus, the semiconductor device 1 may be easily replaced. Further, with the semiconductor device 1 and the electronic device 100 having the semiconductor device 1 according to the first embodiment, even when the mounting component 13 is mounted on the semiconductor device 1, the height of the semiconductor device 1 may be maintained in the Z direction, or a change in the height of the electronic device 100 may be minimized. Hereinafter, detailed effects of the electronic device 100 according to the first embodiment will be described.

There is a demand for easy attachment and detachment of the SSD mounted on the printed circuit board provided in the information processing apparatus (or electronic device). For example, laptop PCs have different SSD storage capacities depending on the product. Such SSDs with different storage capacities may be sealed in packages of the same standard or shape. If the packages of the same standard or shape are provided and then the SSDs may be easily replaced, it is possible to easily produce products with different SSD storage capacities. That is, it is possible to easily create a variation in products.

However, it is assumed that the BGA or LGA used in the semiconductor device to constitute an SSD is connected to the printed circuit board by melting a solder. When the printed circuit board is connected to a connection terminal of the semiconductor device (the solder ball 9 in the case of the semiconductor device 1 according to the first embodiment) by melting a solder, the SSD may not be easily removed.

Meanwhile, a comparative example is conceivable in which, instead of connecting the printed circuit board to the connection terminal of the semiconductor device by melting a solder, the semiconductor device is designed to be provided on the printed circuit board by being covered with mounting components from above.

However, since this comparative example has a structure in which the semiconductor device having a flat surface is covered with the mounting component, the overall height is increased by the thickness of the mounting component. If the height of the electronic device is increased, the electronic device consumes a large amount of space in the information processing apparatus, and may not be used for, for example, a thin laptop PC.

Meanwhile, the electronic device 100 according to the first embodiment has a structure capable of facilitating the removal of the semiconductor device 1 without changing the overall height of the electronic device 100 or while minimizing a change in the height of the electronic device 100.

Specifically, the semiconductor device 1 according to the first embodiment has the groove 5 in a part of the upper surface of the sealing resin 12 of the semiconductor device 1. When the mounting component 13 is inserted into a part of the groove 5, increasing the height of the electronic device 100 in the Z direction may be prevented.

That is, when the height of the upper portion 13A of the mounting component 13 in the Z direction falls within the depth of the groove 5, it is possible for the electronic device 100 according to the first embodiment to fix the semiconductor device 1 to the printed circuit board 15 by the mounting component 13 without changing the height of the electronic device 100. Even when the height of the upper portion 13A of the mounting component 13 in the Z direction exceeds the depth of the groove 5, it is possible for the electronic device 100 according to the first embodiment to fix the semiconductor device 1 to the printed circuit board 15 by the mounting component 13 while minimizing a change in the height of the electronic device 100 compared to the comparative example.

Further, with the electronic device 100 according to the first embodiment, heat dissipation is easier compared to the comparative example. Since the comparative example has a structure in which the entire upper surface of the semiconductor device is covered with a mounting component, heat dissipation from the surface of the semiconductor device may be hindered, and it may be difficult to dissipate heat generated by the semiconductor device. Meanwhile, in the electronic device 100 according to the first embodiment, the mounting component 13 covers the upper surface of the semiconductor device 1 only in the groove 5. Therefore, it is possible for the electronic device 100 according to the first embodiment to dissipate heat from a portion not covered with the mounting component 13. Moreover, when the mounting component 13 is made of a material that easily dissipates heat, it may be expected to easily dissipate heat from a portion covered with the mounting component.

Further, with the electronic device 100 according to the first embodiment, it is possible to make it difficult to fix the semiconductor device 1 to the printed circuit board 15 in an incorrect orientation. Specifically, when the groove 5 is provided, for example, in a non-linearly symmetrical manner in the upper surface of the sealing resin 12, it is possible to prevent the semiconductor device 1 from being placed in an incorrect orientation when the semiconductor device 1 is fixed to the printed circuit board 15. For example, the intersection of the cross of the groove 5 may not be provided at the center of the sealing resin 12, but may be shifted in the X direction and/or in the Y direction. For example, the shape of the groove 5 may be formed in a non-linearly symmetrical shape instead of a linearly symmetrical shape such as the cross.

[2] Second Embodiment

[2-1] Configuration (Structure)

Hereinafter, an example of a configuration of a semiconductor device 2 and an electronic device 102 according to a second embodiment will be described. The semiconductor device 2 and the electronic device 102 differ from the first embodiment in terms of the shapes of the mounting component and the groove and the number of screws. With respect to other structures and functions, the second embodiment is almost the same as the first embodiment. Hereinafter, the semiconductor device 2 and the electronic device 102 according to the second embodiment will be mainly described with respect to differences from the first embodiment.

[2-1-1] Configuration of Semiconductor Device 2

Figure 5:
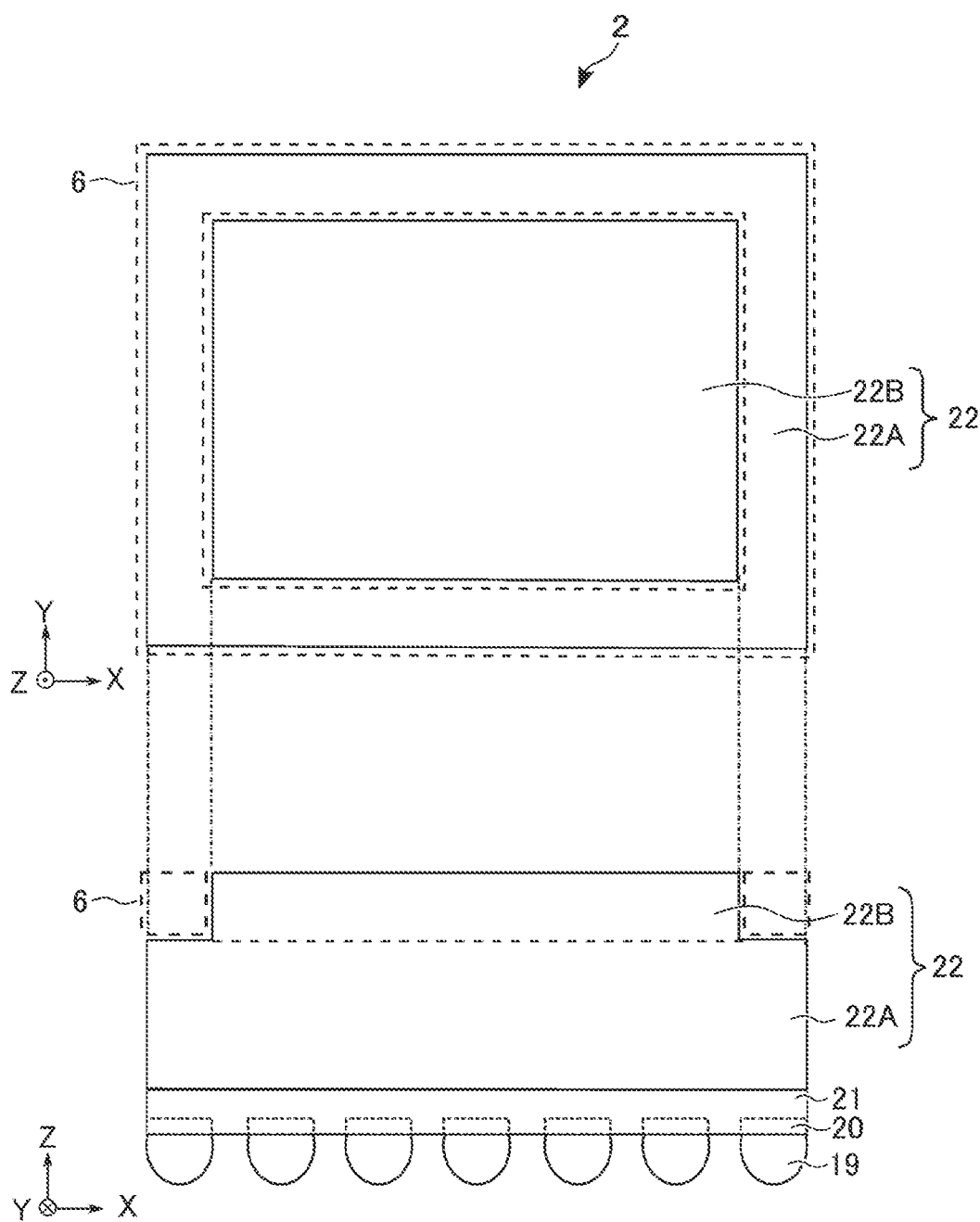
FIG. 5 illustrates a configuration example of a semiconductor device according to a second embodiment.

FIG. 5 illustrates a configuration example of the semiconductor device 2 according to the second embodiment. The upper view of FIG. 5 is a plan view (XY plane) of the semiconductor device 2 seen from the +Z direction, and illustrates a view seen from the same direction as the upper view of FIG. 1. The lower view of FIG. 5 is a side view (XZ plane) of the semiconductor device 2 seen from the −Y direction, and illustrates a view seen from the same direction as the lower view of FIG. 1.

As illustrated in FIG. 5, the semiconductor device 2 includes, for example, a plurality of terminals 20, a plurality of solder balls 19, a substrate 21, and a sealing resin 22. Since the substrate 21, the solder balls 19, and the terminals 20 have the same configuration and function as the substrate 11, the solder balls 9, and the terminals 10 according to the first embodiment, respectively, a detailed description thereof will be omitted.

The sealing resin 22 is located above the substrate 21 (in the +Z direction). The sealing resin 22 has a rectangular shape in the XY plane. The sealing resin 22 has edges coinciding with the edges of the substrate 21 in the XY plane. The sealing resin 22 has a groove 6 having a shape surrounding the edges of the sealing resin 22 in the XY plane. In other words, the groove 6 has a shape in which the area of the sealing resin 22 is partially reduced by making, in the XY plane, both edges of the sealing resin 22 in the X direction closer to the center and both edges in the Y direction closer to the center.

Hereinafter, the groove 6 will be described in detail. The sealing resin 22 has a difference in height in the Z direction depending on the location. Specifically, it is as follows. The sealing resin 22 includes a first portion 22A and a second portion 22B. The first portion 22A occupies a lower side (−Z side) portion of the sealing resin 22, and has a rectangular parallelepiped shape. The second portion 22B occupies an upper side (+Z side) portion of the sealing resin 22, and has a rectangular parallelepiped shape. The first portion 22A and the second portion 22B are continuous (that is, continuously provided) in the Z direction and are integrally formed. The second portion 22B is not located on a part of the upper surface (XY surface seen from the +Z direction) of the first portion 22A. The upper surface (XY surface seen from the +Z direction) of the first portion 22A is exposed in a region where the second portion 22B is not located. That is, the groove 6 is formed in a region where the upper surface of the first portion 22A is exposed and the second portion 22B is not located. By having this shape, the sealing resin 22 has a difference in height in the Z direction depending on the location. That is, the sealing resin 22 has a lower height in the Z direction in the exposed region of the upper surface of the first portion 22A compared to the other region. The groove 6 is a space created by a difference in height in the Z direction between the exposed portion of the upper surface of the first portion 22A and the upper surface of the second portion 22B.

In other words, the sealing resin 22 has a structure in which the second portion 22B having a rectangular parallelepiped shape with a smaller area than the first portion 22A in the XY plane is provided on the first portion 22A having a rectangular parallelepiped shape. The second portion 22B is disposed so as not to protrude from the first portion 22A in the XY plane. For example, in the XY plane, the second portion 22B may have a shape similar to that of the first portion 22A. For example, the center of the second portion 22B in the XY plane coincides with the center of the first portion 22A in the XY plane. A space created by the second portion 22B being smaller than the first portion 22A is the groove 6. The groove 6, i.e., the region where the upper surface of the first portion 22A is exposed, has a certain width in the XY plane and extends along the edge of the second portion 22B.

The groove 6 may be formed in the same manner as the groove 5 according to the first embodiment. Details of the depth and shape of the groove 6 will be described later. Here, the depth of the groove 6 corresponds to the height of the second portion 22B in the Z direction.

[2-1-2] Configuration of Electronic Device 102

An example of a configuration in a state where the semiconductor device 2 is provided on a printed circuit board 25 will be described with reference to FIG. 6.

Figure 6:
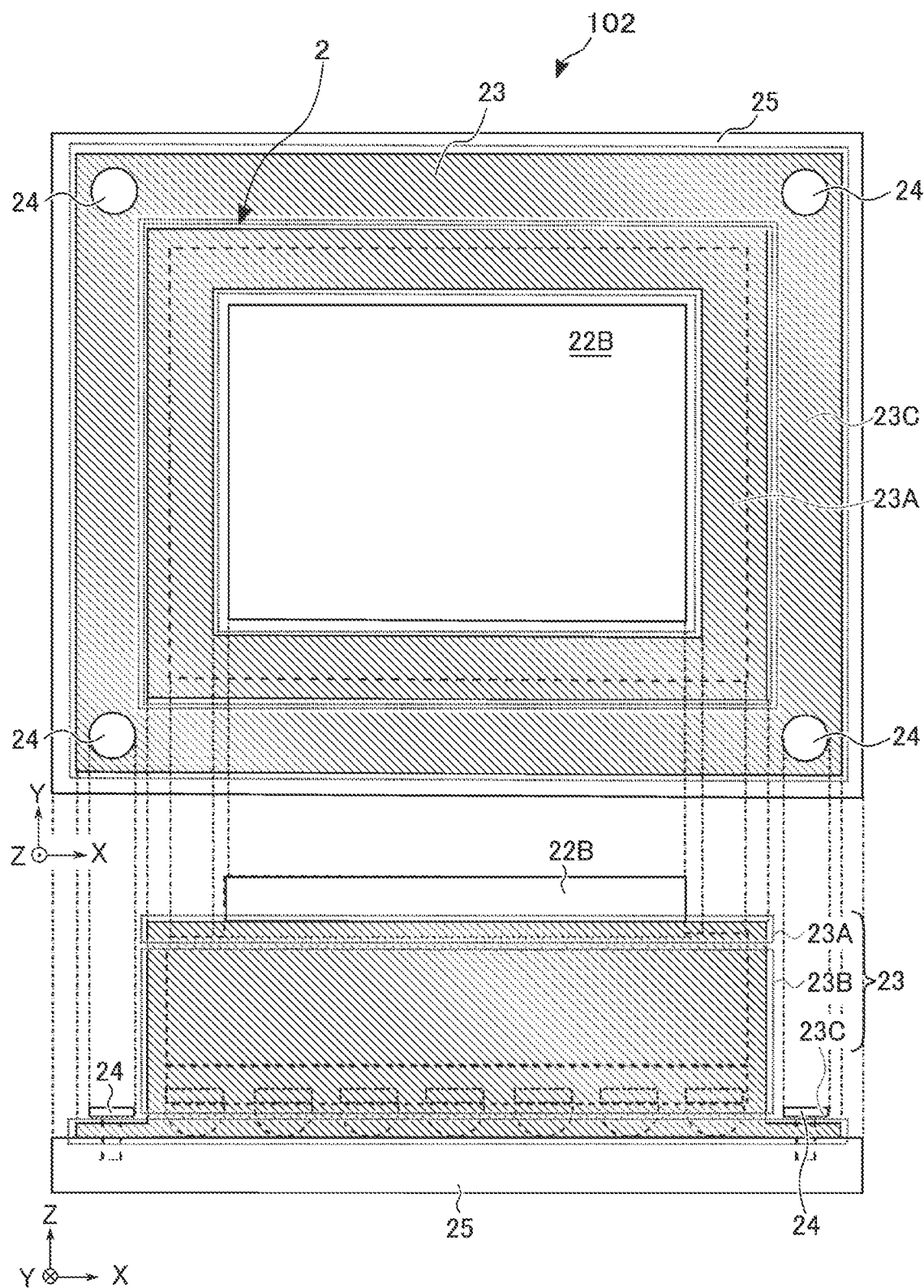
FIG. 6 illustrates a configuration example of an electronic device according to the second embodiment.

FIG. 6 illustrates a configuration example of the electronic device 102 according to the second embodiment. The upper view of FIG. 6 is a plan view of the electronic device 102, and illustrates a view seen from the same direction as the upper view of FIG. 5. The lower view of FIG. 6 is a side view of the electronic device 102, and illustrates a view seen from the same direction as the lower view of FIG. 5.

As illustrated in FIG. 6, the electronic device 102 includes, for example, the semiconductor device 2 illustrated in FIG. 5, a mounting component 23, a screw 24, and the printed circuit board 25. Since the printed circuit board 25 and the screw 24 have the same structure and function as the printed circuit board 15 and the screw 14 according to the first embodiment, respectively, a detailed description thereof will be omitted.

The mounting component 23 has a portion covering an exposed portion of the upper surface of the first portion 22A of the sealing resin 22, i.e., the bottom surface of the groove 6, a portion extending in the Z direction, and a portion in contact with the printed circuit board 25. The portion covering the bottom surface of the groove 6, the portion extending in the Z direction, and the portion in contact with the printed circuit board 25 may be hereinafter referred to as an upper portion 23A, a side portion 23B, and a contact portion 23C, respectively. The upper portion 23A, the side portion 23B, and the contact portion 23C are continuously and integrally formed. A part of the upper portion 23A and a part of the side portion 23B are connected at a right angle within a range that allows errors in manufacturing. The other part of the side portion 23B and a part of the contact portion 23C are connected at a right angle within a range that allows errors in manufacturing.

The upper portion 23A has a shape surrounding the edges of the sealing resin 22 in the XY plane. The upper portion 23A has, for example, the same shape as the groove 6. The upper portion 23A has a shape capable of being fitted into the groove 6. When the upper portion 23A is fitted into the groove 6, the upper portion 23A may press the bottom surface of the groove 6. In other words, the upper portion 23A may be positioned so as to be fitted into the groove 6. When the upper portion 23A presses the bottom surface of the groove 6, the mounting component 23 may prevent the shift of the semiconductor device 2 in the XY direction. Further, since the upper portion 23A is located in the groove 6, the electronic device 102 according to the second embodiment can be kept in height in the Z direction, similarly to the electronic device 100 according to the first embodiment.

The upper portion 23A may have a size in the XY direction capable of pressing the bottom surface of the groove 6. In order to prevent the shift of the semiconductor device 2 in the XY direction, it is desirable that the size of the upper portion 23A in the XY direction be close to the size of the groove 6 in the XY direction. More specifically, the meaning of the size of the upper portion 23A in the XY direction being close to the size of the groove 6 in the XY direction includes that the widths in the X direction and the Y direction of respective portions constituting the upper portion 23A are close respectively to the widths in the X direction and the Y direction of respective portions constituting the groove 6 and/or that the lengths of the upper portion 23A in the X direction and the Y direction are close respectively to the lengths of the groove 6 in the X direction and the Y direction.

The height (or thickness) of the upper portion 23A in the Z direction may exceed the depth of the groove 6 as long as it may prevent the shift of the semiconductor device 2 in the XY direction, similarly to the first embodiment. However, in order to keep the height of the electronic device 102 in the Z direction, it is desirable that the height of the upper portion 23A in the Z direction be within the depth of the groove 6. Further, the groove 6 may have a depth such that the upper portion 23A is stably fitted into the groove 6.

The side portion 23B extends in the Z direction. In a state where the upper portion 23A is fitted into the groove 6, the side portion 23B extends in the Z direction from the rectangular edge of the upper portion 23A to the printed circuit board 25. In other words, in a state where the upper portion 23A is fitted into the groove 6, the side portion 23B extends in the Z direction along the side surface of the semiconductor device 2. The side portion 23B may have a length in the Z direction by which the shift of the semiconductor device 2 in the Z direction may be prevented when the semiconductor device 2 is fixed or provided on the printed circuit board 25.

The contact portion 23C has a shape spreading along the XY plane. The contact portion 23C has a hole through which the screw 24 passes. In a state where the semiconductor device 2 is fixed or provided on the printed circuit board 25, the contact portion 23C is in contact with the printed circuit board 25.

In this way, the mounting component 23 mainly prevents the shift of the semiconductor device 2 in the XY direction by the upper portion 23A, mainly prevents the shift of the semiconductor device 2 in the Z direction by the side portion 23B, and fixes, along with the screw 24, the semiconductor device 2 to the printed circuit board 25 via the contact portion 23C. That is, the mounting component 23 has a function of pressing the semiconductor device 2 against the printed circuit board 25.

As used herein, the term "fixing" means fixing made by tightening the screw 24. Therefore, when it is desired to remove the semiconductor device 2 from the printed circuit board 25, the semiconductor device 2 may be easily removed by loosening the screw 24.

Similarly to the first embodiment, the solder balls 19 and the printed circuit board 25 are not fixed to each other, for example, by melting a solder, and may be separated from each other. That is, the semiconductor device 2 according to the second embodiment is designed to be movable with respect to the printed circuit board 25 of the electronic device 102.

From the above, in the electronic device 102 according to the second embodiment, similarly to the first embodiment, the sealing resin 22 of the semiconductor device 2 has the groove 6, the mounting component 23 has a shape to be fitted into the groove 6, and the mounting component 23 may be easily removed by the screw 24 or the like.

In the electronic device 102 according to the second embodiment, the groove 6 of the semiconductor device 2 and the mounting component 23 may have a shape in which the upper portion 23A capable of being fitted into the groove 6, so that the semiconductor device 2 may be fixed to the printed circuit board 25 by the mounting component 23.

Similarly, with the structure in which the upper portion 23A is fitted into the groove 6 so that the semiconductor device 2 may be fixed to the printed circuit board 25 by the mounting component 23, the shape of the semiconductor device 2 in the XY plane seen from the +Z direction may not be a quadrangle. The shape of the semiconductor device 2 in the XY plane seen from the +Z direction may be, for example, a shape in which one of the corners of a quadrangle is chamfered.

[2-2] Advantages (Effects) of Second Embodiment

With the semiconductor device 2 and the electronic device 102 having the semiconductor device 2 according to the second embodiment described above, the same effects as those of the first embodiment may be obtained even in a structure different from that of the first embodiment.

The sealing resin 22 of the semiconductor device 2 provided in the electronic device 102 according to the second embodiment has the groove 6. Therefore, with the electronic device 102 according to the second embodiment, it is possible to fix the semiconductor device 2 to the printed circuit board by the mounting component 23, similarly to the first embodiment. Accordingly, even when the mounting component 23 is mounted on the semiconductor device 2, the height of the semiconductor device 2 may be maintained in the Z direction, or a change in the height of the electronic device 102 may be minimized.

Further, similarly to the first embodiment, the electronic device 102 according to the second embodiment is easier to dissipate heat compared to the comparative example.

Further, similarly to the first embodiment, the electronic device 102 according to the second embodiment may make it difficult to fix the semiconductor device 2 to the printed circuit board 25 in an incorrect orientation by providing the groove 6 in a non-linearly symmetrical manner.

[3] Third Embodiment

[3-1] Configuration (Structure)

Hereinafter, an example of a configuration of a semiconductor device 3 and an electronic device 103 according to a third embodiment will be described. The semiconductor device 3 and the electronic device 103 differ from the first embodiment and the second embodiment in terms of the shapes of the mounting component and the groove and the number of screws. With respect to other structures and functions, the third embodiment is almost the same as the first embodiment. Hereinafter, the semiconductor device 3 and the electronic device 103 according to the third embodiment will be mainly described with respect to differences from the first embodiment.

[3-1-1] Configuration of Semiconductor Device 3

Figure 7:
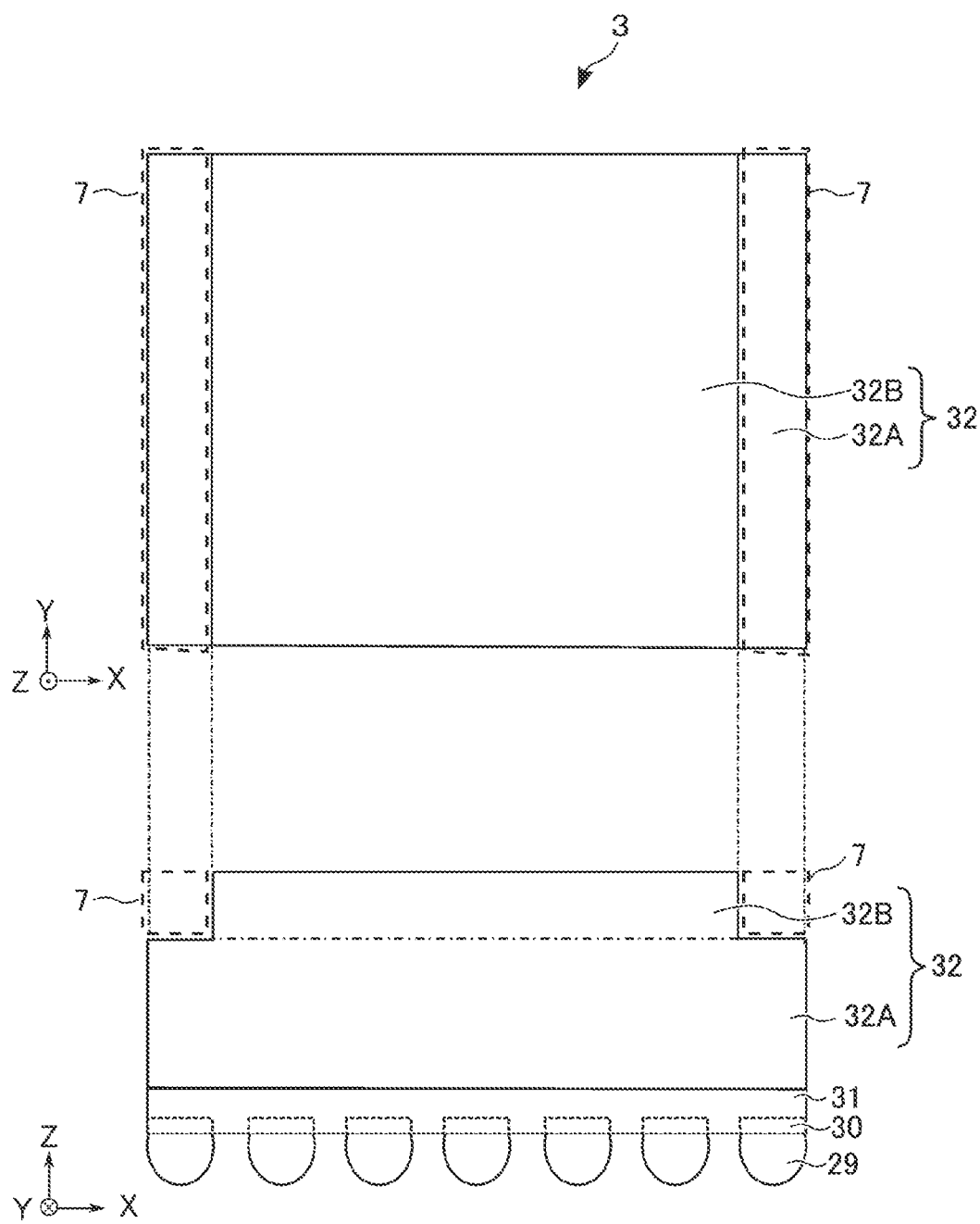
FIG. 7 illustrates a configuration example of a semiconductor device according to a third embodiment.

FIG. 7 illustrates a configuration example of the semiconductor device 3 according to the third embodiment. The upper view of FIG. 7 is a plan view (XY plane) of the semiconductor device 3 seen from the +Z direction, and illustrates a view seen from the same direction as the upper view of FIG. 1. The lower view of FIG. 7 is a side view (XZ plane) of the semiconductor device 3 seen from the −Y direction, and illustrates a view seen from the same direction as the lower view of FIG. 1.

As illustrated in FIG. 7, the semiconductor device 3 includes, for example, a plurality of terminals 30, a plurality of solder balls 29, a substrate 31, and a sealing resin 32. Since the substrate 31, the solder balls 29, and the terminals 30 have the same configuration and function as the substrate 11, the solder balls 9, and the terminals 10 according to the first embodiment, respectively, a detailed description thereof will be omitted.

The sealing resin 32 is located above the substrate 31 (in the +Z direction). The sealing resin 32 has a rectangular shape in the XY plane. The sealing resin 32 has edges coinciding with the edges of the substrate 31 in the XY plane. The sealing resin 32 has two grooves 7 having a shape that extends in the Y direction along the edges of the sealing resin 32 in the XY plane. In other words, each groove 7 has, for example, a rectangular parallelepiped shape. The two grooves 7 are respectively located at both edges of the sealing resin 32 in the Y direction.

Hereinafter, the groove 7 will be described in detail. The sealing resin 32 has a difference in height in the Z direction depending on the location. Specifically, it is as follows. The sealing resin 32 includes a first portion 32A and a second portion 32B. The first portion 32A occupies a lower side (−Z side) portion of the sealing resin 32, and has a rectangular parallelepiped shape. The second portion 32B occupies an upper side (+Z side) portion of the sealing resin 32, and has a rectangular parallelepiped shape. The first portion 32A and the second portion 32B are continuous (that is, continuously provided) in the Z direction and are integrally formed. The second portion 32B is not located on a part of the upper surface (XY surface seen from the +Z direction) of the first portion 32A. The upper surface of the first portion 32A is exposed in a region where the second portion 32B is not located. That is, the groove 7 is formed in a region where the upper surface of the first portion 32A is exposed and the second portion 32B is not located. By having this shape, the sealing resin 32 has a difference in height in the Z direction depending on the location. That is, the sealing resin 32 has a lower height in the Z direction in the exposed region of the upper surface of the first portion 32A compared to the other region. The groove 7 is a space created by a difference in height in the Z direction between the exposed portion of the upper surface of the first portion 32A and the upper surface of the second portion 32B.

In other words, the sealing resin 32 has a structure in which the second portion 32B having a rectangular parallelepiped shape with a smaller area (or a shorter length) in the X direction than the first portion 32A in the XY plane is provided on the first portion 32A having a rectangular parallelepiped shape. The size of the second portion 32B in the Y direction is the same as the size of the first portion 32A in the Y direction. The second portion 32B is disposed so as not to protrude from the first portion 32A in the XY plane. For example, the center of the second portion 32B in the XY plane coincides with the center of the first portion 32A in the XY plane. A space created by the second portion 32B being smaller than the first portion 32A is the groove 7. The groove 7, i.e., the region where the upper surface of the first portion 32A is exposed, has a certain width in the XY plane and extends along the edge of the second portion 32B in the Y direction.

The groove 7 may be formed in the same manner as the groove 5 according to the first embodiment. Details of the depth and shape of the groove 7 will be described later. Here, the depth of the groove 7 corresponds to the height of the second portion 32B in the Z direction.

[3-1-2] Configuration of Electronic Device 103

An example of a configuration in a state where the semiconductor device 3 is provided on a printed circuit board 35 will be described with reference to FIG. 8.

Figure 8:
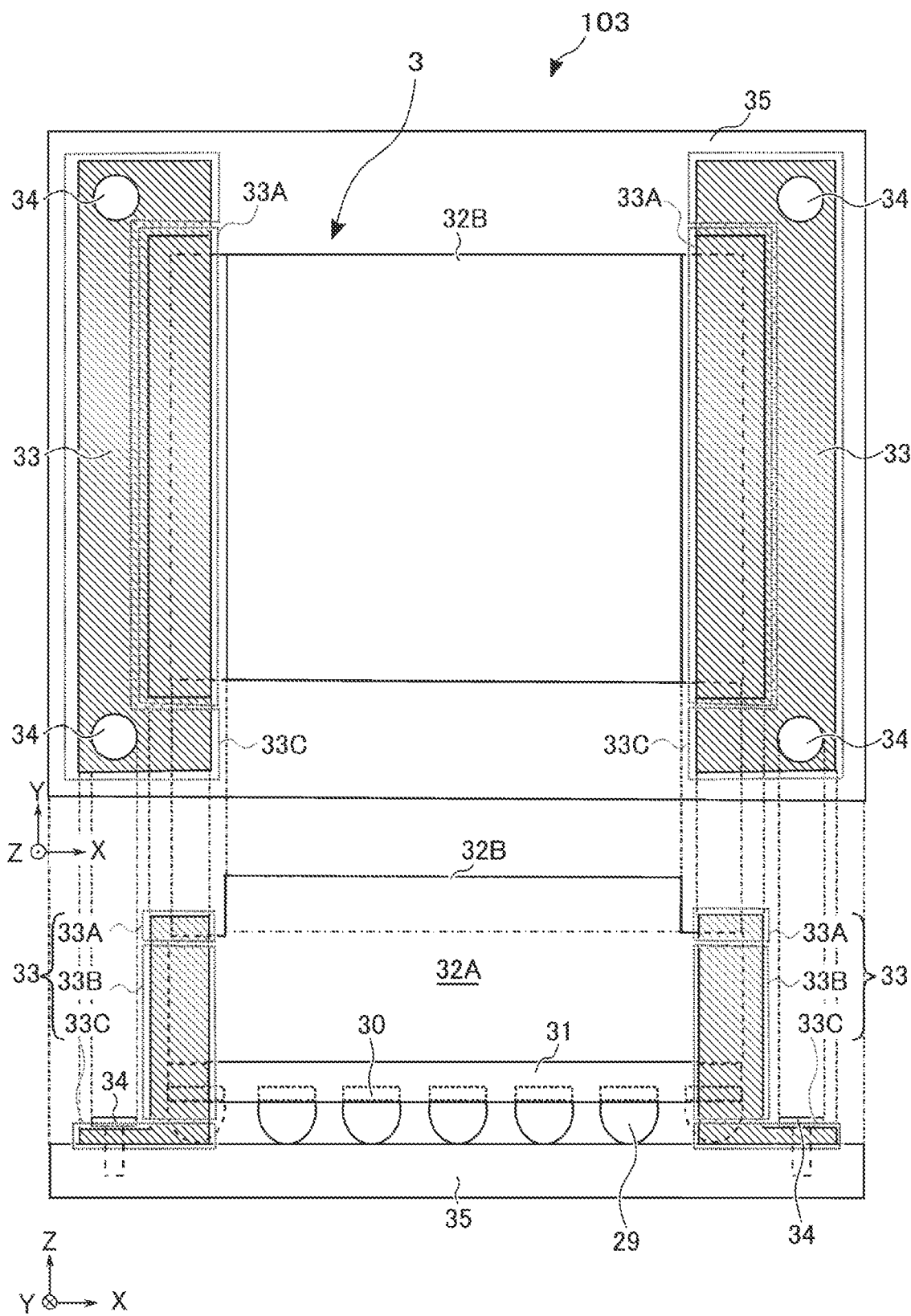
FIG. 8 illustrates a configuration example of an electronic device according to the third embodiment.

FIG. 8 illustrates a configuration example of the electronic device 103 according to the third embodiment. The upper view of FIG. 8 is a plan view of the electronic device 103, and illustrates a view seen from the same direction as the upper view of FIG. 7. The lower view of FIG. 8 is a side view of the electronic device 103, and illustrates a view seen from the same direction as the lower view of FIG. 7.

As illustrated in FIG. 8, the electronic device 103 includes, for example, the semiconductor device 3 illustrated in FIG. 7, a mounting component 33, a screw 34, and the printed circuit board 35. Since the printed circuit board 35 and the screw 34 have the same structure and function as the printed circuit board 15 and the screw 14 according to the first embodiment, respectively, a detailed description thereof will be omitted.

The mounting component 33 has a portion covering an exposed portion of the upper surface (the XY surface seen from the +Z direction) of the first portion 32A of the sealing resin 32, i.e., the bottom surface of the groove 7, a portion extending in the Z direction, and a portion in contact with the printed circuit board 35. The portion covering the bottom surface of the groove 7, the portion extending in the Z direction, and the portion in contact with the printed circuit board 35 may be hereinafter referred to as an upper portion 33A, a side portion 33B, and a contact portion 33C, respectively. The upper portion 33A, the side portion 33B, and the contact portion 33C are continuously and integrally formed. A part of the upper portion 33A and a part of the side portion 33B are connected at a right angle within a range that allows errors in manufacturing. The other part of the side portion 33B and a part of the contact portion 33C are connected at a right angle within a range that allows errors in manufacturing.

The upper portion 33A has a shape extending in the Y direction along the edge of the sealing resin 32 in the XY plane. The upper portion 33A has, for example, the same shape as the groove 7 and presses the bottom surface of the groove 7. In other words, the upper portion 33A is positioned so as to be fitted into the groove 7. When the upper portion 33A presses the bottom surface of the groove 7, the mounting component 33 may prevent the shift of the semiconductor device 3 in the XY direction. Further, since the upper portion 33A is located in the groove 7, the electronic device 103 according to the third embodiment may be kept in height in the Z direction, similarly to the electronic device 100 according to the first embodiment.

The upper portion 33A may have a size in the XY direction capable of pressing the bottom surface of the groove 7. In order to prevent the shift of the semiconductor device 3 in the XY direction, it is desirable that the size of the upper portion 33A in the XY direction be close to the size of the groove 7 in the XY direction. More specifically, the meaning of the size of the upper portion 33A in the XY direction being close to the size of the groove 7 in the XY direction includes that the widths in the X direction and the Y direction of respective portions constituting the upper portion 33A are close respectively to the widths in the X direction and the Y direction of respective portions constituting the groove 7 and/or that the lengths of the upper portion 33A in the X direction and the Y direction are close respectively to the lengths of the groove 7 in the X direction and the Y direction.

The height (or thickness) of the upper portion 33A in the Z direction may exceed the depth of the groove 7 as long as it may prevent the shift of the semiconductor device 3 in the XY direction, similarly to the first embodiment. However, in order to keep the height of the electronic device 103 in the Z direction, it is desirable that the height of the upper portion 33A in the Z direction be within the depth of the groove 7. Further, the groove 7 may have a depth such that the upper portion 33A is stably fitted into the groove 7.

The side portion 33B extends in the Z direction. In a state where the upper portion 33A is fitted into the groove 7, the side portion 33B extends in the Z direction from the rectangular edge of the upper portion 33A to the printed circuit board 35. In other words, in a state where the upper portion 33A is fitted into the groove 7, the side portion 33B extends in the Z direction along the side surface of the semiconductor device 3. The side portion 33B may have a length in the Z direction by which the shift of the semiconductor device 3 in the Z direction may be prevented when the semiconductor device 3 is fixed or provided on the printed circuit board 35.

The contact portion 33C has a shape that spreads along the XY plane. The contact portion 33C has a hole through which the screw 34 passes. In a state where the semiconductor device 3 is fixed or provided on the printed circuit board 35, the contact portion 33C is in contact with the printed circuit board 35.

In this way, the mounting component 33 mainly prevents the shift of the semiconductor device 3 in the XY direction by the upper portion 33A, mainly prevents the shift of the semiconductor device 3 in the Z direction by the side portion 33B, and fixes, along with the screw 34, the semiconductor device 3 to the printed circuit board 35 via the contact portion 33C. That is, the mounting component 33 has a function of pressing the semiconductor device 3 against the printed circuit board 35.

As used herein, the term "fixing" means fixing made by tightening the screw 34. Therefore, when it is desired to remove the semiconductor device 3 from the printed circuit board 35, the semiconductor device 3 may be easily removed by loosening the screw 34.

Similarly to the first embodiment, the solder balls 29 and the printed circuit board 35 are not fixed by, for example, melting a solder, and may be separated from each other. That is, the semiconductor device 3 according to the third embodiment is designed to be movable with respect to the printed circuit board 35 of the electronic device 103.

From the above, in the electronic device 103 according to the third embodiment, similarly to the first embodiment, the sealing resin 32 of the semiconductor device 3 has the groove 7, the mounting component 33 has a shape to be fitted into the groove 7, and the mounting component 33 may be easily removed by the screw 34 or the like.

In the electronic device 103 according to the third embodiment, the groove 7 of the semiconductor device 3 and the mounting component 33 may have a shape in which the upper portion 33A capable of being fitted into the groove 7, so that the semiconductor device 3 may be fixed to the printed circuit board 35 by the mounting component 33.

Similarly, with the structure in which the upper portion 33A is fitted into the groove 7 so that the semiconductor device 3 may be fixed to the printed circuit board 35 by the mounting component 33, the shape of the semiconductor device 3 in the XY plane seen from the +Z direction may not be a quadrangle. The shape of the semiconductor device 3 in the XY plane seen from the +Z direction may be, for example, a shape in which one of the corners of a quadrangle is chamfered.

[3-2] Advantages (Effects) of Third Embodiment

With the semiconductor device 3 and the electronic device 103 having the semiconductor device 3 according to the third embodiment described above, the same effects as those of the first embodiment may be obtained even in a structure different from that of the first embodiment.

The sealing resin 32 of the semiconductor device 3 provided in the electronic device 103 according to the third embodiment has the groove 7. Therefore, with the electronic device 103 according to the third embodiment, it is possible to fix the semiconductor device 3 to the printed circuit board 35 by the mounting component 33, similarly to the first embodiment and the second embodiment. Accordingly, even when the mounting component 33 is mounted on the semiconductor device 3, the height of the semiconductor device 3 may be maintained in the Z direction, or a change in the height of the electronic device 103 may be minimized.

Further, similarly to the first embodiment, the electronic device 103 according to the third embodiment is easier to dissipate heat compared to the comparative example.

Further, similarly to the first embodiment, the electronic device 103 according to the third embodiment may make it difficult to fix the semiconductor device 3 to the printed circuit board 35 in an incorrect orientation by providing the groove 7 in a non-linearly symmetrical manner.

[4] Fourth Embodiment

[4-1] Configuration (Structure)

Hereinafter, an example of a configuration of a semiconductor device 4 and an electronic device 104 according to a fourth embodiment will be described. The semiconductor device 4 and the electronic device 104 differ from the third embodiment in terms of the shapes of the mounting component, the substrate, the sealing resin, the screw, and the groove and the number of screws. With respect to other structures and functions, the fourth embodiment is almost the same as the third embodiment. Hereinafter, the semiconductor device 4 and the electronic device 104 according to the fourth embodiment will be mainly described with respect to differences from the third embodiment.

[4-1-1] Configuration of Semiconductor Device 4

Figure 9:
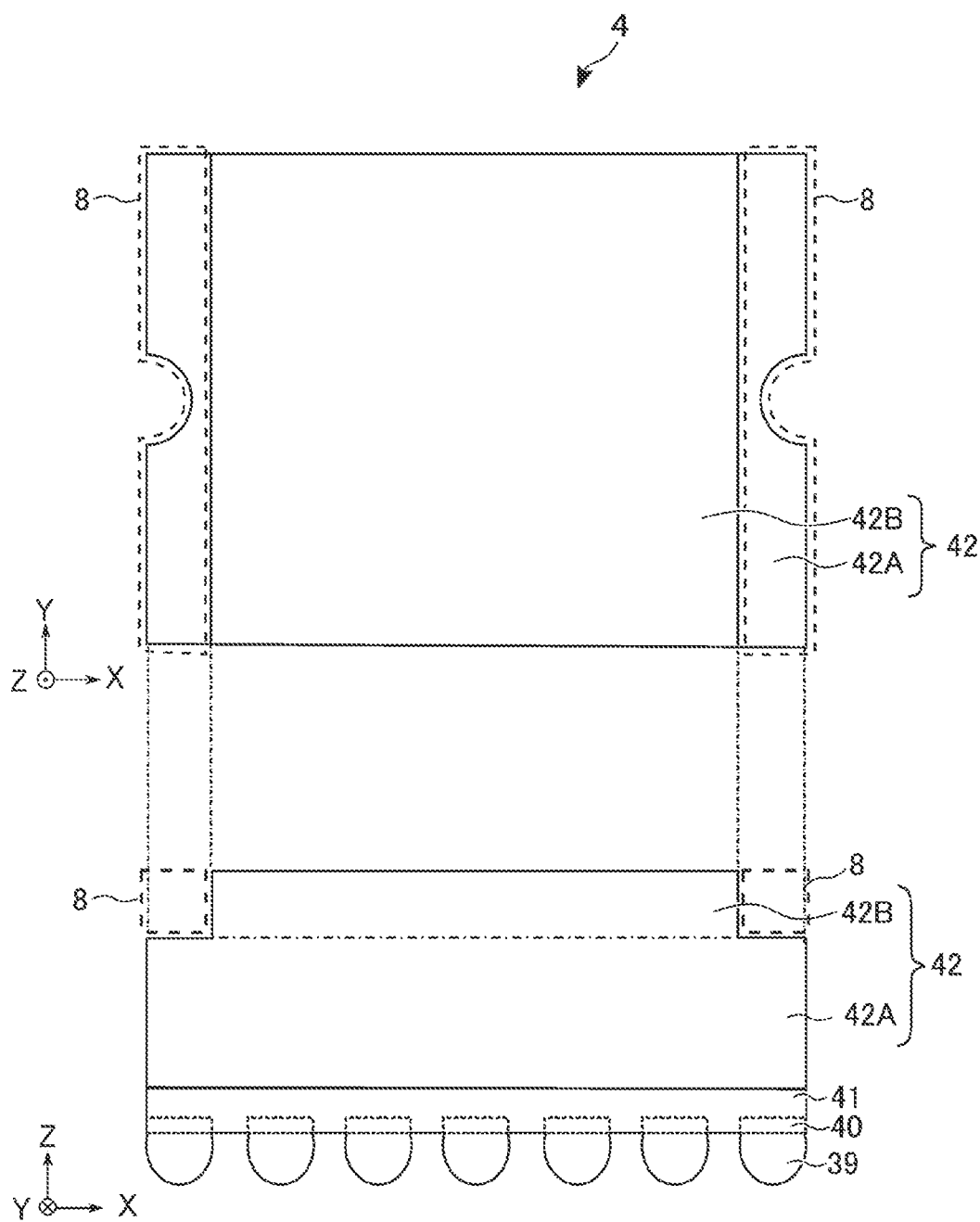
FIG. 9 illustrates a configuration example of a semiconductor device according to a fourth embodiment.

FIG. 9 illustrates a configuration example of the semiconductor device 4 according to the fourth embodiment. The upper view of FIG. 9 is a plan view (XY plane) of the semiconductor device 4 seen from the +Z direction, and illustrates a view seen from the same direction as the upper view of FIG. 7. The lower view of FIG. 9 is a side view (XZ plane) of the semiconductor device 4 seen from the −Y direction, and illustrates a view seen from the same direction as the lower view of FIG. 7.

As illustrated in FIG. 9, the semiconductor device 4 includes, for example, a plurality of terminals 40, a plurality of solder balls 39, a substrate 41, and a sealing resin 42. Since the solder balls 39 and the terminals 40 have the same configuration and function as the solder balls 29 and the terminals 30 according to the third embodiment, respectively, a detailed description thereof will be omitted.

The substrate 41 has the same function as the substrate according to the third embodiment, and differs from the substrate 31 in terms of the shape. The substrate 41 has a rectangular shape in the XY plane and has, for example, a semicircular concave shape at an edge along the Y direction. In other words, each edge of the substrate 41 extending in the Y direction has a portion that is not along the Y direction, and the portion that is not along the Y direction has a concave semicircular shape. A screw 44 (see FIG. 10) to be described later is fitted into the portion having a semicircular concave shape.

The sealing resin 42 is located above the substrate 41 (in the +Z direction). The sealing resin 42 has edges coinciding with the edges of the substrate 41 in the XY plane. That is, the sealing resin 42 has a rectangular shape and has, for example, a semicircular concave shape at the edges along the Y direction in the XY plane. The sealing resin 42 has two grooves 8 having a shape that extends in the Y direction along the edges of the sealing resin 42 in the XY plane. In other words, each groove 8 has, for example, a rectangular parallelepiped shape. The two grooves 8 are respectively located at both edges of the sealing resin 42 in the Y direction. The groove 8 includes a semicircular concave portion.

Hereinafter, the groove 8 will be described in detail. The sealing resin 42 has a difference in height in the Z direction depending on the location. Specifically, it is as follows. The sealing resin 42 includes a first portion 42A and a second portion 42B. The first portion 42A occupies a lower side (−Z side) portion of the sealing resin 42. The first portion 42A has a shape in which, in a second surface of a rectangular parallelepiped along the ZY plane, a part of the edge is recessed in the Z direction, for example, in a semi-cylindrical shape. The recessed portion extends, for example, in the Z direction and spans from the upper surface in the Z direction to the bottom surface in the Z direction of the first portion 42A. Specifically, four sides extending in the Y direction of a rectangular parallelepiped of the first portion 42A each have a semicircular concave shape in a portion thereof. Among the four sides of the first portion 42A extending in the Y direction, two sides located on the −X side of the first portion 42A face each other in the semicircular portion along the Z direction. Similarly, among the four sides of the first portion 42A extending in the Y direction, two sides located on the +X side of the first portion 42A face each other in the semicircular portion along the Z direction. In other words, the two sides located on the −X side of the first portion 42A are at the same position in the X direction and the Y direction, respectively, and are at different positions in the Z direction. The two sides located on the +X side of the first portion 42A are at the same position in the X direction and the Y direction, respectively, and are at different positions in the Z direction.

The second portion 42B occupies an upper side (+Z side) portion of the sealing resin 42, and has a rectangular parallelepiped shape. The first portion 42A and the second portion 42B are continuous (that is, continuously provided) in the Z direction and are integrally formed. The second portion 42B is not located on a part of the upper surface (XY surface seen from the +Z direction) of the first portion 42A.

The upper surface of the first portion 42A is exposed in a region where the second portion 42B is not located. That is, the groove 8 is formed in a region where the upper surface of the first portion 42A is exposed and the second portion 42B is not located. By having this shape, the sealing resin 42 has a difference in height in the Z direction depending on the location. That is, the sealing resin 42 has a lower height in the Z direction in the exposed region of the upper surface of the first portion 42A compared to the other region. The groove 8 is a space created by a difference in height in the Z direction between the exposed portion of the upper surface of the first portion 42A and the upper surface of the second portion 42B.

In other words, the sealing resin 42 has a structure in which the second portion 42B having a rectangular parallelepiped shape with a smaller size (or a shorter length) in the X direction than the first portion 42A in the XY plane is provided on the first portion 42A having a rectangular parallelepiped shape in which a part of the edge along the ZY surface is recessed in a semi-cylindrical shape in the Z direction. The size of the second portion 42B in the Y direction is the same as the size of the first portion 42A in the Y direction. The second portion 42B is disposed so as not to protrude from the first portion 42A in the XY plane. For example, the center of the second portion 42B in the XY plane coincides with the center of the first portion 42A in the XY plane. A space created by the second portion 42B being smaller than the first portion 42A is the groove 8. The groove 8, i.e., the region where the upper surface of the first portion 42A is exposed, has a certain width in the XY plane and extends along the edge of the second portion 42B in the Y direction. The groove 8 includes a semicircular concave portion.

The groove 8 may be formed in the same manner as the groove 7 according to the third embodiment. Details of the depth and shape of the groove 8 will be described later. Here, the depth of the groove 8 corresponds to the height of the second portion 42B in the Z direction.

[4-1-2] Configuration of Electronic Device 104

An example of a configuration in a state where the semiconductor device 4 is provided on a printed circuit board 45 will be described with reference to FIG. 10.

Figure 10:
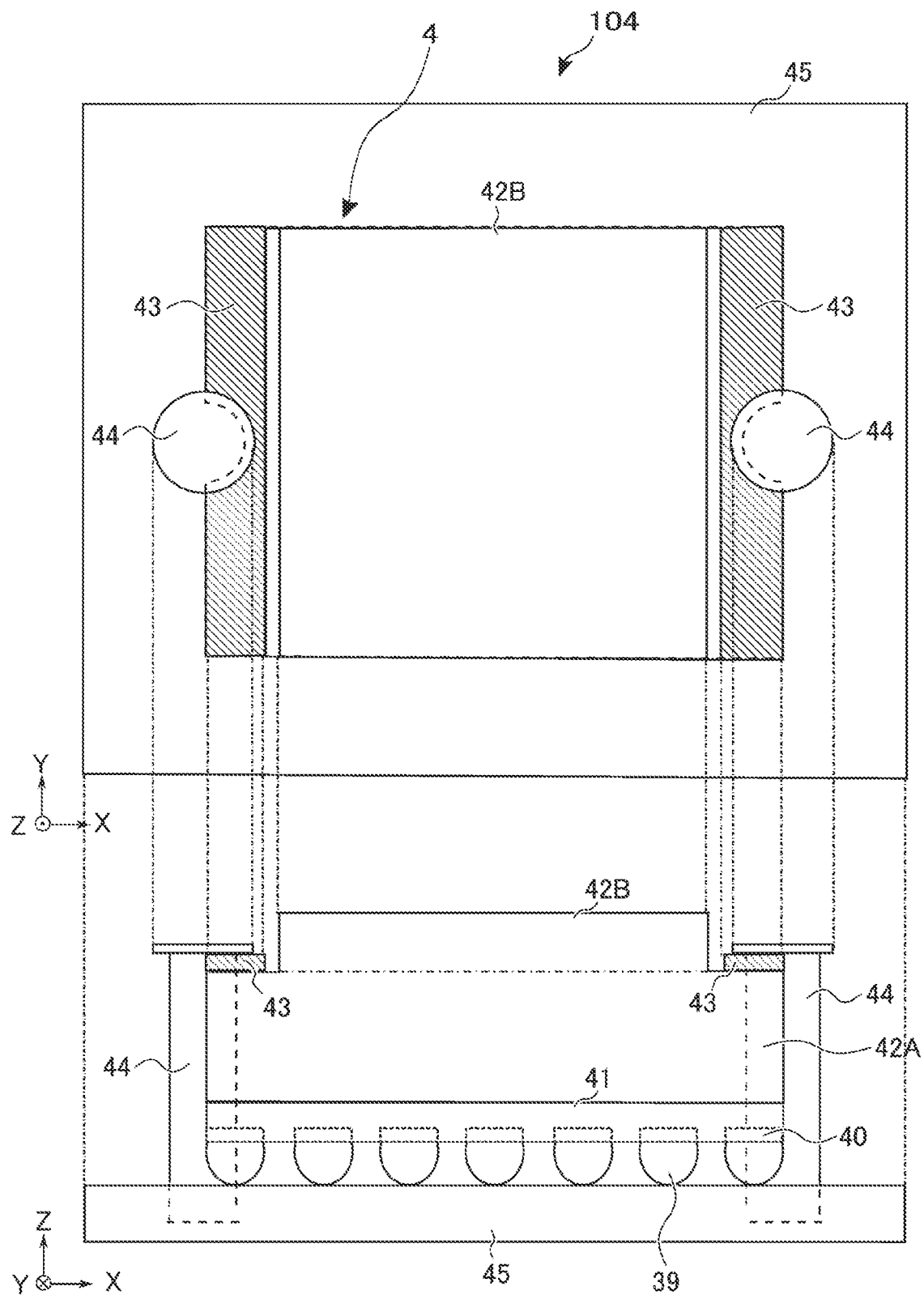
FIG. 10 illustrates a configuration example of an electronic device according to the fourth embodiment.

FIG. 10 illustrates a configuration example of the electronic device 104 according to the fourth embodiment. The upper view of FIG. 10 is a plan view of the electronic device 104, and illustrates a view seen from the same direction as the upper view of FIG. 9. The lower view of FIG. 10 is a side view of the electronic device 104, and illustrates a view seen from the same direction as the lower view of FIG. 9.

As illustrated in FIG. 10, the electronic device 104 includes, for example, the semiconductor device 4 illustrated in FIG. 9, a mounting component 43, a screw 44, and the printed circuit board 45. Since the printed circuit board 45 has the same configuration and function as the printed circuit board 35 according to the third embodiment, a detailed description thereof will be omitted.

The mounting component 43 has a portion covering an exposed portion of the upper surface (the XY surface seen from the +Z direction) of the first portion 42A of the sealing resin 42, i.e., the bottom surface of the groove 8. Unlike the mounting components 13, 23 and 33, the mounting component 43 does not have a portion extending in the Z direction (portion corresponding to the side portions 13B, 23B, and 33B of the mounting components 13, 23 and 33) and a portion in contact with the printed circuit board 45 (portion corresponding to the contact portions 13C, 23C and 33C of the mounting components 13, 23 and 33). In the mounting component 43, the functions corresponding to the side portions 13B, 23B and 33B and the contact portions 13C, 23C and 33C of the mounting components 13, 23 and 33 are supplemented by the screw 44 and the semicircular concave portions provided in the substrate 41 and the sealing resin 42. These details will be described later.

The mounting component 43 has a shape extending along the edge of the sealing resin 42 in the Y direction in the XY plane. The mounting component 43 has, for example, the same shape as the groove 8 and presses the bottom surface of the groove 8. In other words, the mounting component 43 is positioned so as to be fitted into the groove 8. When the mounting component 43 presses the bottom surface of the groove 8 along with the screw 44, the mounting component 43 may prevent the shift of the semiconductor device 4 in the XY direction. Further, since the mounting component 43 is located in the groove 8, the electronic device 104 according to the fourth embodiment may be kept in height in the Z direction, similarly to the electronic device 103 according to the third embodiment.

The mounting component 43 may have a size in the XY direction capable of pressing the bottom surface of the groove 8. In order to prevent the shift of the semiconductor device 4 in the XY direction, it is desirable that the size of the mounting component 43 in the XY direction be close to the size of the groove 8 in the XY direction. More specifically, the meaning of the size of the mounting component 43 in the XY direction being close to the size of the groove 8 in the XY direction includes that the widths in the X direction and the Y direction of respective portions constituting the mounting component 43 are close respectively to the widths in the X direction and the Y direction of respective portions constituting the groove 8 and/or that the lengths of the mounting component 43 in the X direction and the Y direction are close respectively to the lengths of the groove 8 in the X direction and the Y direction.

The height (or thickness) of the mounting component 43 in the Z direction may exceed the depth of the groove 8 as long as it prevents the shift of the semiconductor device 4 in the XY direction, similarly to the third embodiment. However, in order to keep the height of the electronic device 104 in the Z direction, it is desirable that the height of the mounting component 43 in the Z direction be within the depth of the groove 8. Further, the groove 8 may have a depth such that the mounting component 43 is stably fitted into the groove 8.

The screw 44 has a function of fixing the mounting component 43 and the semiconductor device 4 to the printed circuit board 45. A part of the screw 44 is fitted into the semicircular concave portions provided in the substrate 41 and the sealing resin 42. The screw 44 is inserted into a hole provided in the printed circuit board 45. For example, when the screw 44 is a male screw, a groove corresponding to a thread provided on the screw 44 may be formed inside the hole in the printed circuit board 45 into which the screw 44 is inserted. By inserting and fitting the screw 44 into the hole provided in the printed circuit board 45, the mounting component 43 sandwiched between the screw 44 and the printed circuit board 45 is fixed. The semiconductor device 4 is fixed to the printed circuit board 45 by fixing the mounting component 43.

The screw 44 extends in the Z direction. The screw 44 extends in the Z direction from the edge of a semicircular concave portion of the mounting component 43 to the printed circuit board 45 in a state where it is fitted into the semicircular concave portions provided in the substrate 41 and the sealing resin 42. In other words, the screw 44 extends in the Z direction along the side surface of the semiconductor device 4 while being fitted into the semicircular concave portions provided in the substrate 41 and the sealing resin 42. The screw 44 may have a length in the Z direction by which the shift of the semiconductor device 4 in the Z direction may be prevented when the semiconductor device 4 is provided on the printed circuit board 45.

In this way, the screw 44 is mainly embedded in the semicircular concave portions provided in the mounting component 43, the substrate 41, and the sealing resin 42, thereby preventing the shift of the semiconductor device 4 in the XY direction. Further, the screw 44 prevents the shift of the semiconductor device 4 in the Z direction by being mainly inserted into the hole provided in the printed circuit board 45, and fixes the semiconductor device 4 to the printed circuit board 45 along with the mounting component 43. That is, the screw 44 and the mounting component 43 have a function of pressing the semiconductor device 4 against the printed circuit board 45.

As used herein, the term "fixing" means fixing made by tightening the screw 44. Therefore, when it is desired to remove the semiconductor device 4 from the printed circuit board 45, the semiconductor device 4 may be easily removed by loosening the screw 44.

Similarly to the third embodiment, the solder balls 39 and the printed circuit board 45 are not fixed by, for example, melting a solder, and may be separated from each other. That is, the semiconductor device 4 according to the fourth embodiment is designed to be movable with respect to the printed circuit board of the electronic device 104 and the like.

In the example of FIG. 10, two screws 44 are illustrated. However, the number of screws 44 may be optionally set as long as they are capable of fixing the mounting component 43 to the printed circuit board 45. For example, the electronic device 104 may have two or more screws in one of the two grooves 8.

Further, the electronic device 104 may have a stud and the like interposed between the screw 44 and the printed circuit board 45. That is, instead of directly inserting the screw 44 into the hole formed in the printed circuit board 45, a part of the stud is embedded in the hole formed in the printed circuit board 45 and is fixed in the hole. The fixed stud extends in the Z direction. The stud has a hole at the top (+Z side) thereof. A groove corresponding to a thread provided on the screw 44 which is, for example, a male screw may be formed inside the hole of the stud. By inserting and fitting the screw 44 into the hole provided in the stud, the entire semiconductor device 4 is fixed to the printed circuit board 45. That is, the screw 44 fixes the mounting component 43 and the semiconductor device 4 to the printed circuit board 45 via the stud.

From the above, in the electronic device 104 according to the fourth embodiment, similarly to the third embodiment, the sealing resin 42 of the semiconductor device 4 has the groove 8, the mounting component 43 has a shape to be fitted into the groove 8, and the mounting component 43 may be easily removed by the screw 44 or the like. Further, in the electronic device 104 according to the fourth embodiment, the mounting component 43, the substrate 41, and the sealing resin 42 have semicircular portions into which a part of the screw 44 may be fitted.

In the electronic device 104 according to the fourth embodiment, the groove 8 of the semiconductor device 4 and the mounting component 43 may have a shape capable of being fitted into the groove 8, so that the semiconductor device 4 may be fixed to the printed circuit board 45 by the mounting component 43. The semicircular concave portions provided in the mounting component 43, the substrate 41, and the sealing resin 42 may have a shape other than the semicircular shape as long as a part of the screw 44 may be fitted thereinto. For example, the concave portions may have an arc shape or polygonal shape.

Similarly, with the structure in which the mounting component 43 is fitted into the groove 8 so that the semiconductor device 4 may be fixed to the printed circuit board 45 by the mounting component 43 and the screw 44, the shape of the semiconductor device 4 in the XY plane seen from the +Z direction may not be a quadrangle. The shape of the semiconductor device 4 in the XY plane seen from the +Z direction may be, for example, a shape in which one of the corners of a quadrangle is chamfered.

[4-2] Advantages (Effects) of Fourth Embodiment

With the semiconductor device 4 and the electronic device 104 having the semiconductor device 4 according to the fourth embodiment described above, the same effects as those of the third embodiment may be obtained even in a structure different from that of the third embodiment.

The sealing resin 42 of the semiconductor device 4 provided in the electronic device 104 according to the fourth embodiment has the groove 8. Further, in the electronic device 104 according to the fourth embodiment, the mounting component 43, the substrate 41, and the sealing resin 42 have the semicircular concave portions into which a part of the screw 44 may be fitted. Therefore, with the electronic device 104 according to the fourth embodiment, it is possible to fix the semiconductor device 4 to the printed circuit board 45 by the mounting component 43 and the screw 44, similarly to the third embodiment. Accordingly, even when the mounting component 43 is mounted on the semiconductor device 4, the height of the semiconductor device 4 may be maintained in the Z direction, or a change in the height of the electronic device 104 may be minimized.

Further, similarly to the third embodiment, the electronic device 104 according to the fourth embodiment is easier to dissipate heat compared to the comparative example.

Further, similarly to the third embodiment, the electronic device 104 according to the fourth embodiment may make it difficult to fix the semiconductor device 4 to the printed circuit board 45 in an incorrect orientation by providing the groove 8 in a non-linearly symmetrical manner.

[5] Other Modifications and More

In the first to fourth embodiments, the semiconductor devices 1, 2, 3 and 4 and the electronic devices 100, 102, 103 and 104 having the respective semiconductor devices 1, 2, 3 and 4 may have other structures.

As used herein, the term "connection" indicates that elements are electrically connected, and does not exclude, for example, that another element is interposed therebetween. The expression "elements are electrically connected" may allow an insulator to be interposed between the elements as long as the elements may operate in the same manner as being electrically connected. The terms "Substantially the same" and "approximately the same" also contain errors due to manufacturing deviations. The terms "edge" correspond to the term "end" in the meaning.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
   a substrate spreading along a first surface;
   a semiconductor chip disposed above the substrate in a first direction;
   a resin covering the semiconductor chip; and
   a terminal disposed below the substrate in the first direction,
   wherein the resin includes a first portion and a second portion, a height of the first portion in the first direction is higher than a height of the second portion in the first direction,
   wherein an edge of the second portion in a second direction along the first surface is a part of an edge of the resin in the second direction, and
   wherein only the first portion of the resin is configured to fix the terminal to a printed circuit board through a solder ball.

2. The semiconductor device according to claim 1, wherein the second portion extends in the second direction.

3. The semiconductor device according to claim 1, wherein the second portion includes (i) a first sub-portion extending in the second direction and (ii) a second sub-portion extending in a third direction along the first surface, the third direction intersecting the second direction,
   an edge of the first sub-portion in the second direction is a part of the edge of the resin in the second direction, and
   an edge of the second sub-portion in the third direction is a part of an edge of the resin in the third direction.

4. The semiconductor device according to claim 3, further comprising a groove disposed between respective sub-portions.

5. The semiconductor device according to claim 4, wherein the groove has a rectangular parallelepiped shape.

6. The semiconductor device according to claim 1, wherein the second portion includes a plurality of nth sub-portions extending in a plurality of nth directions along the first surface, where n is an integer of 2 or more, and
   an edge of each of the plurality of nth sub-portions in the nth direction is a part of an edge of the resin in the nth direction.

7. The semiconductor device according to claim 1, wherein the second portion includes a first sub-portion and a second sub-portion, the second sub-portion spaced apart from the first sub-portion, each of the first sub-portion and the second sub-portion extending in the second direction.

8. The semiconductor device according to claim 7, wherein the second portion further includes a third sub-portion and a fourth sub-portion, the fourth sub-portion spaced apart from the third sub-portion, each of the third sub-portion and the fourth sub-portion extending in a third direction along the first surface, the third direction intersecting the second direction,
   the resin has a first side and a second side which are arranged in the second direction, and has a third side and a fourth side which are arranged in the third direction, and the first sub-portion includes the first side, the second sub-portion includes the second side, the third sub-portion includes the third side, and the fourth sub-portion includes the fourth side.

9. The semiconductor device according to claim 7, wherein the resin has a first side and a second side arranged in the second direction,
the first sub-portion includes the first side, and the second sub-portion includes the second side, and
each of the first side and the second side has a portion having a semicircular shape, an arc shape, or a polygonal shape.

10. The semiconductor device according to claim 1, wherein the solder ball is connected to the terminal.

11. An electronic device comprising:
the semiconductor device according to claim 1;
the printed circuit board having a second terminal electrically connected to the terminal and having a first hole;
a mounting component having a third portion disposed above the second portion, a fourth portion having a second hole, and a fifth portion extending in the first direction and connecting the third portion to the fourth portion; and
a fixing component having a portion spanning over the first hole and the second hole.

12. The electronic device according to claim 11, wherein a length of the third portion in the first direction is equal to or shorter than a difference between a length of the first portion and a length of the second portion in the first direction.

13. The electronic device according to claim 11, wherein the fixing component is configured to fix the mounting component to the printed circuit board.

14. The electronic device according to claim 13, wherein the resin has semicircular concave portions into which the fixing component is fitted.

15. The electronic device according to claim 13, wherein the fixing component includes one or more screws.

16. The electronic device according to claim 11, wherein the fixing component is attachable to and detachable from the printed circuit board.

17. The electronic device according to claim 11, further comprising solder balls electronically connected between the semiconductor device and the printed circuit board.

18. The electronic device according to claim 11, wherein the second portion includes (i) a first sub-portion extending in the second direction and (ii) a second sub-portion extending in a third direction along the first surface, the third direction intersecting the second direction,
an edge of the first sub-portion in the second direction is a part of the edge of the resin in the second direction, and
an edge of the second sub-portion in the third direction is a part of an edge of the resin in the third direction.

19. The electronic device according to claim 11, wherein the second portion includes a first sub-portion and a second sub-portion, the second sub-portion spaced apart from the first sub-portion, each of the first sub-portion and the second sub-portion extending in the second direction.

20. An electronic device comprising:
the semiconductor device according to claim 1;
the printed circuit board having a second terminal electrically connected to the terminal and having a first hole;
a mounting component including a third portion disposed above the second portion; and
a fixing component having a fourth portion extending over the mounting component, a fifth portion embedded in the first hole, and a sixth portion connecting the fourth portion to the fifth portion,
wherein the first portion of the resin has a concave portion, and
the sixth portion of the fixing component is disposed in the concave portion.

* * * * *